(12) United States Patent
Umeda

(10) Patent No.: US 9,041,394 B2
(45) Date of Patent: May 26, 2015

(54) MAGNETIC RESONANCE IMAGING APPARATUS EXECUTING PHASE-CORRECTED IMAGING PULSE SEQUENCE BASED ON DATA OBTAINED FROM MULTIPLE PULSE SUB-SEQUENCES EXECUTED WITHOUT READOUT DIRECTION GRADIENTS BUT INSTEAD USING PHASE OR SLICE ENCODING DIRECTION GRADIENTS DURING READOUT

(75) Inventor: Masaaki Umeda, Sakura (JP)

(73) Assignees: KABUSHIKI KAISHA TOSHIBA, Tokyo (JP); TOSHIBA MEDICAL SYSTEMS CORPORATION, Otawara-Shi, Tochigi (JP)

( * ) Notice: Subject to any disclaimer, the term of this patent is extended or adjusted under 35 U.S.C. 154(b) by 739 days.

(21) Appl. No.: 13/149,080

(22) Filed: May 31, 2011

(65) Prior Publication Data
US 2011/0291653 A1    Dec. 1, 2011

(30) Foreign Application Priority Data

May 31, 2010 (JP) ................................ 2010-124996
Apr. 7, 2011 (JP) ................................ 2011-085630

(51) Int. Cl.
  *G01R 33/565*    (2006.01)
  *G01R 33/561*    (2006.01)

(52) U.S. Cl.
  CPC ...... *G01R 33/5617* (2013.01); *G01R 33/56554* (2013.01)

(58) Field of Classification Search
  USPC .......................... 324/300–322; 382/128–131; 600/407–435
  See application file for complete search history.

(56) References Cited

U.S. PATENT DOCUMENTS

| | | | | |
|---|---|---|---|---|
| 4,870,361 A | * | 9/1989 | In Den Kleef et al. | 324/309 |
| 4,982,161 A | * | 1/1991 | Twieg | 324/309 |
| 5,262,725 A | * | 11/1993 | Cuppen et al. | 324/312 |
| 5,347,218 A | * | 9/1994 | Van Yperen | 324/309 |
| 5,450,010 A | * | 9/1995 | Van Der Meulen et al. | 324/309 |
| 5,493,224 A | * | 2/1996 | Shiono et al. | 324/309 |
| 5,647,362 A | * | 7/1997 | Fuderer et al. | 600/410 |
| 5,729,139 A | * | 3/1998 | Goto | 324/309 |

(Continued)

FOREIGN PATENT DOCUMENTS

| | | |
|---|---|---|
| CN | 1403054 A | 3/2003 |
| EP | 0 634 664 A1 | 1/1995 |

(Continued)

*Primary Examiner* — Melissa Koval
*Assistant Examiner* — Tiffany Fetzner
(74) *Attorney, Agent, or Firm* — Nixon & Vanderhye P.C.

(57) ABSTRACT

A magnetic resonance imaging apparatus according to an embodiment includes an executing unit, a calculating unit, and a correcting unit. The executing unit executes a first pre-scan in which a readout gradient magnetic field and a phase encoding gradient magnetic field are not applied and sampling gradient magnetic fields is applied in a phase encoding direction and a second pre-scan in which the readout gradient magnetic field is not applied, the sampling gradient magnetic field is applied at the same echo signal as that in the first pre-scan, and a representative phase encoding gradient magnetic field in a main scan. The calculating unit calculates the amount of correction from phase differences between the echo signals collected by the first pre-scan and between the echo signals collected by the second pre-scan. The correcting unit corrects the pulse sequence for the main scan on the basis of the calculated amount of correction.

20 Claims, 12 Drawing Sheets

(56) References Cited

U.S. PATENT DOCUMENTS

| | | | |
|---|---|---|---|
| 5,818,229 A * | 10/1998 | Kanazawa | 324/307 |
| 5,928,146 A * | 7/1999 | Itagaki et al. | 600/410 |
| 6,150,815 A * | 11/2000 | Janzen et al. | 324/309 |
| 6,160,397 A * | 12/2000 | Washburn et al. | 324/309 |
| 6,218,834 B1 * | 4/2001 | Goto | 324/307 |
| 6,285,900 B1 * | 9/2001 | Stuber et al. | 600/410 |
| 6,331,777 B1 * | 12/2001 | Van Den Brink et al. | 324/312 |
| 6,369,568 B1 | 4/2002 | Ma et al. | 324/309 |
| 6,424,152 B1 * | 7/2002 | Prins et al. | 324/307 |
| 6,470,203 B2 * | 10/2002 | Miyamoto | 600/410 |
| 6,617,850 B2 * | 9/2003 | Welch et al. | 324/309 |
| 6,781,375 B2 | 8/2004 | Miyazaki et al. | 324/314 |
| 7,141,970 B2 * | 11/2006 | Miyawaki et al. | 324/307 |
| 7,622,922 B2 * | 11/2009 | Dannels | 324/309 |
| 7,894,891 B2 * | 2/2011 | Song et al. | 600/546 |
| 7,898,254 B2 * | 3/2011 | Feinberg et al. | 324/309 |
| 8,115,485 B1 * | 2/2012 | Maier et al. | 324/318 |
| 8,154,294 B2 * | 4/2012 | Takizawa et al. | 324/318 |
| 8,159,221 B2 * | 4/2012 | Yui | 324/307 |
| 8,473,046 B2 * | 6/2013 | Song et al. | 600/546 |
| 8,587,305 B2 * | 11/2013 | Madhuranthakam et al. | 324/307 |
| 8,587,310 B2 * | 11/2013 | Taniguchi et al. | 324/309 |
| 8,594,766 B2 * | 11/2013 | Takizawa et al. | 600/415 |
| 8,624,595 B2 * | 1/2014 | Umeda | 324/309 |
| 2001/0017544 A1 * | 8/2001 | Miyamoto | 324/314 |
| 2003/0102864 A1 * | 6/2003 | Welch et al. | 324/307 |
| 2005/0218894 A1 * | 10/2005 | Miyawaki et al. | 324/309 |
| 2007/0238969 A1 * | 10/2007 | Song et al. | 600/410 |
| 2008/0265885 A1 * | 10/2008 | Dannels | 324/312 |
| 2009/0134871 A1 * | 5/2009 | Yui | 324/309 |
| 2009/0177078 A1 * | 7/2009 | Takizawa et al. | 600/415 |
| 2009/0212773 A1 * | 8/2009 | Feinberg et al. | 324/309 |
| 2009/0300843 A1 * | 12/2009 | Matsushita et al. | 5/601 |
| 2010/0164495 A1 * | 7/2010 | Takizawa et al. | 324/309 |
| 2011/0105886 A1 * | 5/2011 | Song et al. | 600/410 |
| 2011/0112393 A1 * | 5/2011 | Taniguchi et al. | 600/410 |
| 2011/0245655 A1 * | 10/2011 | Abe et al. | 600/410 |
| 2011/0291653 A1 * | 12/2011 | Umeda | 324/309 |
| 2012/0249143 A1 * | 10/2012 | Umeda | 324/309 |
| 2012/0313641 A1 * | 12/2012 | Labadie et al. | 324/309 |
| 2013/0057280 A1 * | 3/2013 | Feiweier | 324/309 |
| 2013/0169275 A1 * | 7/2013 | Li et al. | 324/309 |
| 2013/0293231 A1 * | 11/2013 | Hirai | 324/309 |
| 2013/0314090 A1 * | 11/2013 | Taniguchi et al. | 324/322 |
| 2014/0084916 A1 * | 3/2014 | Greiser et al. | 324/306 |
| 2014/0111203 A1 * | 4/2014 | Zhou | 324/309 |

FOREIGN PATENT DOCUMENTS

| | | |
|---|---|---|
| EP | 1 058 123 A1 | 12/2000 |
| JP | 11-019065 | 1/1999 |
| JP | 2004-283627 | 10/2004 |
| JP | 2007-181587 | 7/2007 |

* cited by examiner

EXEMPLARY MRI MAIN SCAN PULSE SEQUENCE

1st PRE-SCAN, 1st PULSE SEQUENCE, 1st EMBODIMENT

2nd PRE-SCAN, 2nd PULSE SEQUENCE, 1st EMBODIMENT

PHASE DIFFERENCE CORRECTION IN PHASE DIRECTION, 1st EMBODIMENT

K-SPACE ARRANGEMENT OF PHASE-ENCODED ECHO SIGNALS

PHASE ENCODING DIRECTION

MODIFIED 1st PRE-SCAN, 1st PULSE SEQUENCE, 1st EMBODIMENT

MODIFIED 2nd PRE-SCAN, 2nd PULSE SEQUENCE, 1st EMBODIMENT

PHASE DIFFERENCES ECHO1 THROUGH ECHO4 OF 1st EMBODIMENT

3rd PULSE SEQUENCE, 3rd PRE-SCAN, 2nd EMBODIMENT

PHASE DIFFERENCE CORRECTION IN PHASE-ENCODING DIRECTION, 2nd EMBODIMENT

GROUPED K-SPACE OF PHASE-ENCODED ECHO SIGNALS

1st PRE-SCAN, 1st PULSE SEQUENCE, 3rd EMBODIMENT

2nd PRE-SCAN, 2nd PULSE SEQUENCE, 3rd EMBODIMENT

GROUPED K-SPACED FOR 2nd AND 3rd PRE-SCAN ECHO SIGNALS

MAGNETIC RESONANCE IMAGING APPARATUS EXECUTING PHASE-CORRECTED IMAGING PULSE SEQUENCE BASED ON DATA OBTAINED FROM MULTIPLE PULSE SUB-SEQUENCES EXECUTED WITHOUT READOUT DIRECTION GRADIENTS BUT INSTEAD USING PHASE OR SLICE ENCODING DIRECTION GRADIENTS DURING READOUT

CROSS-REFERENCE TO RELATED APPLICATIONS

This application is based upon and claims the benefit of priority from Japanese Patent Application No. 2010-124996, filed on May 31, 2010; and Japanese Patent Application No. 2011-85630, filed on Apr. 7, 2011, the entire contents of all of which are incorporated herein by reference.

FIELD

Embodiments described herein relate generally to a magnetic resonance imaging apparatus.

BACKGROUND

As an image taking method related to magnetic resonance imaging apparatuses, a method called "Fast Spin Echo (FSE) method" is conventionally known. The FSE method is an image taking method by which a plurality of echo signals called an echo train are collected by applying a flip pulse to an examined subject and then sequentially applying a plurality of flop pulses to the examined subject. In this situation, the flip pulse is a Radio Frequency (RF) pulse used for exiting atomic nuclear spins within the examined subject. The flop pulses are RF pulses used for refocusing phases of the atomic nuclear spins.

According to the FSE method described above, because the plurality of RF pulses are applied, a stimulated echo is generated together with a spin echo. In some situations, the stimulated echo causes a phase shift in the collected echo signals. Such phase differences among the echo signals may be a cause of degradations of image quality such as sensitivity unevenness, lowering of signal strength, "ghost" phenomena, and the like.

To prevent such degradations of the image quality, generally speaking, a pre-scan for measuring the phase differences among the echo signals is performed prior to a main scan, so that a pulse sequence for the main scan can be corrected based on the phase differences measured during the pre-scan. In this situation, for example, a pulse sequence that cancels the stimulated echo is executed during the pre-scan so that only the spin echo is collected. Further, of the spin echo signals collected during the pre-scan, the first and the second echo signals are Fourier-transformed in a readout direction, so that a zero-order phase difference and a first-order phase difference between the first echo signal and the second echo signal can be calculated. After that, a correction amount is calculated so as to correct a readout direction phase shift and a slice selecting direction phase shift, based on the zero-order phase difference and the first-order phase difference being calculated. The pulse sequence for the main scan is changed, based on the calculated correction amount.

However, according to the conventional technique described above, it is difficult to correct the phase difference occurring in the phase encoding direction by the influence of an overcurrent caused by the phase encoding gradient magnetic field and image quality is likely to deteriorate due to the phase difference.

DETAILED DESCRIPTION

A magnetic resonance imaging apparatus according to an embodiment includes an executing unit, a calculating unit, and a correcting unit. The executing unit executes a first pre-scan while using a first pulse sequence and a second pre-scan while using a second pulse sequence. In the first pulse sequence, a readout gradient magnetic field and a phase encoding gradient magnetic field are not applied, but a plurality of gradient magnetic fields for sampling is applied in a phase encoding direction. In the second pulse sequence, the readout gradient magnetic field is not applied, a sampling gradient magnetic field is applied at the same echo signal as that in the first pulse sequence, and a representative phase encoding gradient magnetic field among the phase encoding gradient magnetic fields applied in a pulse sequence for a main scan is applied. The calculating unit calculates as the amount of correction the amount of phase difference which occurs in the phase encoding direction by the phase encoding gradient magnetic field from the phase difference between a plurality of echo signals collected by the first pre-scan and the phase difference between a plurality of echo signals collected by the second pre-scan. The correcting unit corrects the pulse sequence for the main scan on the basis of the amount of correction calculated by the calculating unit.

In the following sections, exemplary embodiments of a magnetic resonance imaging apparatus and a magnetic resonance imaging method will be explained in detail, with reference to the accompanying drawings. In the description of the exemplary embodiments below, a magnetic resonance imaging apparatus will be referred to as an "MRI apparatus".

Figure 1:
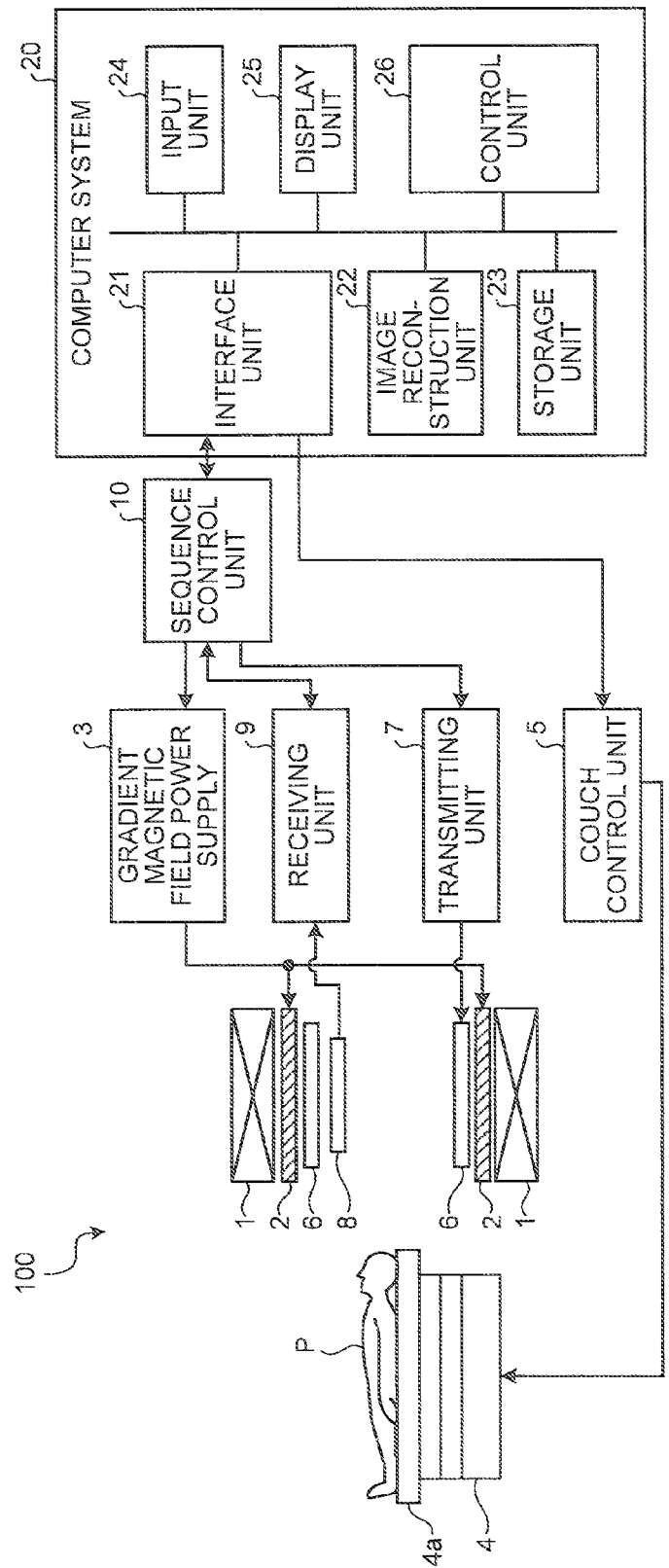
FIG. 1 is a diagram illustrating the structure of an MRI apparatus according to a first embodiment.

FIG. 1 is a diagram of an MRI apparatus according to a first embodiment. As shown in FIG. 1, an MRI apparatus 100 includes a static magnetic field magnet 1, a gradient coil 2, a gradient magnetic field power supply 3, a couch 4, a couch control unit 5, a transmission Radio Frequency (RF) coil 6, a transmitting unit 7, reception RF coil 8, a receiving unit 9, a sequence control unit 10, and a computer system 20.

The static magnetic field magnet 1 is a magnet formed in the shape of a hollow circular cylinder and generates a uniform static magnetic field in the space on the inside thereof. The static magnetic field magnet 1 may be configured by using, for example, a permanent magnet, a superconductive magnet, or the like.

The gradient coil 2 is a coil formed in the shape of a hollow circular cylinder and is disposed on the inside of the static magnetic field magnet 1. The gradient coil 2 is formed by combining three coils corresponding to X-, Y-, and Z-axes that are orthogonal to one another. These three coils individually receive a supply of electric current from the gradient magnetic field power supply 3 (explained later) and generate gradient magnetic fields of which the magnetic field intensities change along the X-, Y-, and Z-axes. It is assumed that the Z-axis direction is the same as the direction of the static magnetic field. The gradient magnetic field power supply 3 supplies the electric current to the gradient coil 2.

In this situation, the gradient magnetic fields on the X-, Y-, and Z-axes that are generated by the gradient coil 2 correspond to, for example, a slice selecting gradient magnetic field Gs which is used for slice selecting, a phase encoding gradient magnetic field Ge which is used for phase encoding, and a readout gradient magnetic field Gr which is used for readout, respectively. The slice selecting gradient magnetic field Gs is used for determining an imaging cross section in an arbitrary manner. The phase encoding gradient magnetic field Ge is used for changing the phase of a magnetic resonance signal according to a spatial position. The readout gradient magnetic field Gr is used for changing the frequency of a magnetic resonance signal according to a spatial position.

The couch 4 includes a couchtop 4a on which an examined subject P is placed. Under control of the couch control unit 5 (explained later), while the examined subject P is placed thereon, the couchtop 4a is inserted into the hollow (i.e., an image taking opening) of the gradient coil 2. Normally, the couch 4 is provided so that the longitudinal direction thereof extends parallel to the central axis of the static magnetic field magnet 1. The couch control unit 5 is a device that controls the couch 4, under control of a control unit 26. The couch control unit 5 drives the couch 4 so that the couchtop 4a moves in the longitudinal direction and in an up-and-down direction.

The transmission RF coil 6 is disposed on the inside of the gradient coil 2 and generates a high frequency magnetic field by receiving a supply of a high frequency pulse from the transmitting unit 7. The transmitting unit 7 transmits the high frequency pulse corresponding to a Larmor frequency to the transmission RF coil 6. The reception RF coil 8 is disposed on the inside of the gradient coil 2 and receives a magnetic resonance signal emitted from the examined subject P due to an influence of the high frequency magnetic field described above. When having received the magnetic resonance signal, the reception RF coil 8 outputs the received magnetic resonance signal to the receiving unit 9.

Based on the magnetic resonance signal being output from the reception RF coil 8, the receiving unit 9 generates magnetic resonance (MR) signal data. The receiving unit 9 generates the MR signal data by applying a digital conversion to the magnetic resonance signal being output from the reception RF coil 8. The MR signal data is brought into correspondence with information about spatial frequencies in a phase encoding direction, a readout direction, and a slice encoding direction by the slice selecting gradient magnetic field Gs, the phase encoding gradient magnetic field Ge, and the readout gradient magnetic field Gr described above and is disposed in a k-space. When having generated the MR signal data, the receiving unit 9 transmits the generated MR signal data to the sequence control unit 10.

The sequence control unit 10 performs a scanning process on the examined subject P, by driving the gradient magnetic field power supply 3, the transmitting unit 7, and the receiving unit 9, based on sequence execution data transmitted from the computer system 20. In this situation, the sequence execution data is information that defines a pulse sequence indicating a procedure for performing the scanning process on the examined subject P, such as the intensity of the electric power supply to be supplied by the gradient magnetic field power supply 3 to the gradient coil 2 and the timing with which the electric power supply is to be supplied; the strength of the RF signal to be transmitted by the transmitting unit 7 to the transmission RF coil 6 and the timing with which the RF signal is to be transmitted; and the timing with which the magnetic resonance signal is to be detected by the receiving unit 9. When the MR signal data is transmitted from the receiving unit 9 after the sequence control unit 10 drives the gradient magnetic field power supply 3, the transmitting unit 7, and the receiving unit 9 based on the sequence execution data, the sequence control unit 10 transfers the MR signal data to the computer system 20.

The computer system 20 exercises overall control of the MRI apparatus 100. For example, the computer system 20 performs the scanning process on the examined subject P and performs an image reconstruction process, by driving the constituent elements included in the MRI apparatus 100. The computer system 20 includes an interface unit 21, an image reconstruction unit 22, a storage unit 23, an input unit 24, a display unit 25, and the control unit 26.

The interface unit 21 controls inputs and outputs of various types of signals that are transmitted to and received from the sequence control unit 10. For example, the interface unit 21 transmits the sequence execution data to the sequence control unit 10 and receives the MR signal data from the sequence control unit 10. When having received the MR signal data, the interface unit 21 stores the received MR signal data into the storage unit 23, for each examined subject P.

The image reconstruction unit 22 generates spectrum data or image data corresponding to desired nuclear spins occurring within the examined subject P, by applying a post-processing process (i.e., a reconstruction process such as a Fourier transform) to the MR signal data stored in the storage unit 23.

The storage unit 23 stores therein various types of data and various types of computer programs that are required in processes (explained later) performed by the control unit 26. For example, the storage unit 23 stores therein, for each examined subject P, the MR signal data received by the interface unit 21, the spectrum data and/or the image data generated by the image reconstruction unit 22, and the like.

The input unit 24 receives various types of instructions and inputs of information from an operator of the MRI apparatus 100. For example, the input unit 24 may be configured by using any of the following as appropriate: a pointing device such as a mouse and/or a trackball; a selecting device such as a mode changing switch; and an input device such as a keyboard.

Under control of the control unit 26, the display unit 25 displays various types of information such as the spectrum data or the image data. The display unit 25 may be configured by using a display device such as a liquid crystal display monitor.

The control unit 26 includes a Central Processing Unit (CPU), a memory, and the like (not shown) and exercises overall control of the MRI apparatus 100. For example, the control unit 26 controls the scanning process by generating various types of sequence execution data based on an imaging condition that is input by the operator via the input unit 24 and transmitting the generated sequence execution data to the sequence control unit 10. Also, when the MR signal data is sent from the sequence control unit 10 as a result of the scanning process, the control unit 26 controls the image reconstruction unit 22 so that an image is restructured based on the MR signal data.

The structure of MRI apparatus 100 according to the first embodiment has been described above. In this structure, MRI apparatus 100 executes the first pre-scan using the first pulse sequence and the second pre-scan using the second pulse sequence. In the first pre-scan, the readout gradient magnetic field and the phase encoding gradient magnetic field are not applied, but a plurality of sampling gradient magnetic fields are applied in the phase encoding direction. In the second pulse sequence, the readout gradient magnetic field is not applied, the sampling gradient magnetic field is applied at the same echo signal as that in the first pulse sequence, and a representative phase encoding gradient magnetic field among the phase encoding gradient magnetic fields which are applied in the pulse sequence for a main scan is applied. The MRI apparatus 100 calculates as the amount of correction the amount of phase difference that occurs in the phase encoding direction by the phase encoding gradient magnetic field from the phase difference between a plurality of echo signals collected by the first pre-scan and the phase difference between a plurality of echo signals collected by the second pre-scan. In addition, MRI apparatus 100 corrects the pulse sequence for a main scan on the basis of the amount of correction calculated by a correction amount calculating unit 26c.

That is, MRI apparatus 100 according to the first embodiment performs each of the first pre-scans in which the phase encoding gradient magnetic field is not applied and the second pre-scan in which the phase encoding gradient magnetic field is applied and calculates the amount of correction of the pulse sequence for a main scan on the basis of the phase difference between the echo signal obtained by the first pre-scan and the echo signal obtained by the second pre-scan. Therefore, according to the first embodiment, it is possible to prevent the deterioration of image quality due to the phase difference in the phase encoding direction. Next, functions of MRI apparatus 100 will be described in detail.

Figure 2:
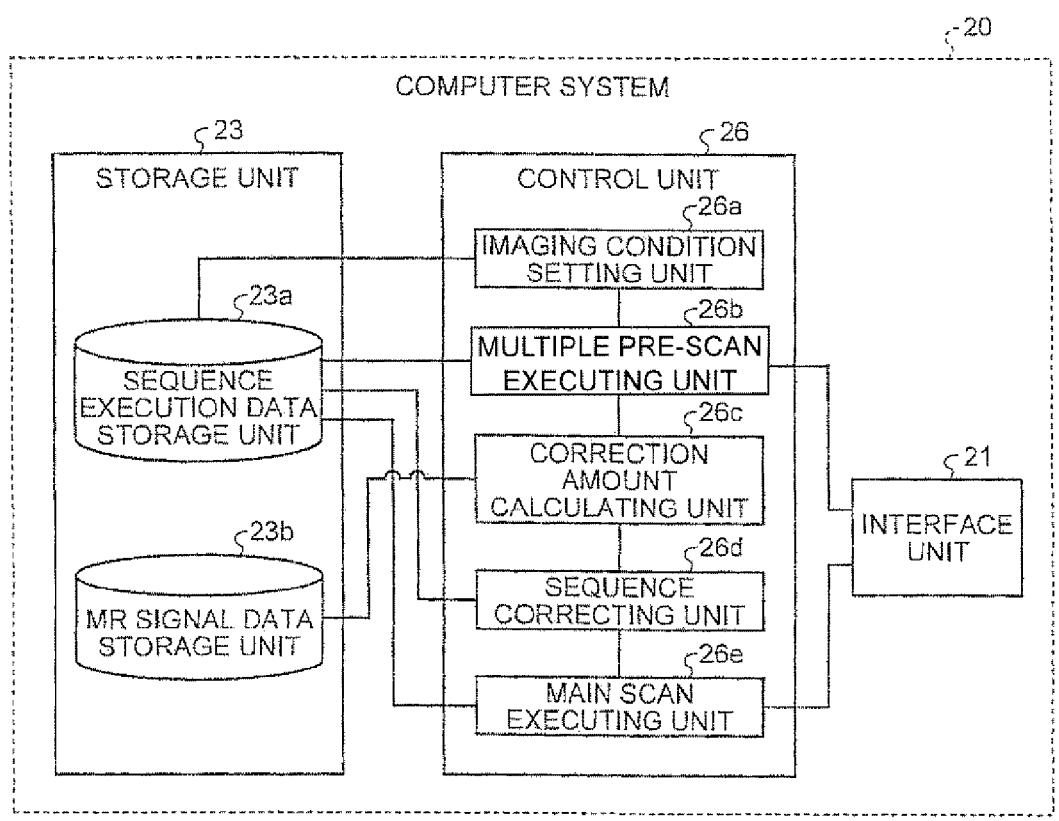
FIG. 2 is a functional block diagram illustrating the detailed structure of a computer system shown in FIG. 1.

FIG. 2 is a functional block diagram illustrating the detailed structure of the computer system 20 shown in FIG. 1. FIG. 2 shows the interface unit 21, the storage unit 23, and the control unit 26 among the functional units of the computer system 20.

The storage unit 23 includes a sequence execution data storage unit 23a and an MR signal data storage unit 23b. The sequence execution data storage unit 23a stores sequence execution data generated by an imaging condition setting unit 26a, which will be described below. The MR signal data storage unit 23b stores the MR signal data received by the interface unit 21.

The control unit 26 includes the imaging condition setting unit 26a, a pre-scan executing unit 26b, the correction amount calculating unit 26c, a sequence correcting unit 26d, and a main scan executing unit 26e.

The imaging condition setting unit 26a generates sequence execution data defining a pulse sequence used to capture images, on the basis of the imaging conditions input by the operator through input unit 24. For example, when the operator inputs the imaging conditions of the FSE method, imaging condition setting unit 26a generates sequence execution data for each of a pulse sequence for a main scan, a first pulse sequence for a first pre-scan, and a second pulse sequence for a second pre-scan, which will be described below.

Figure 3:
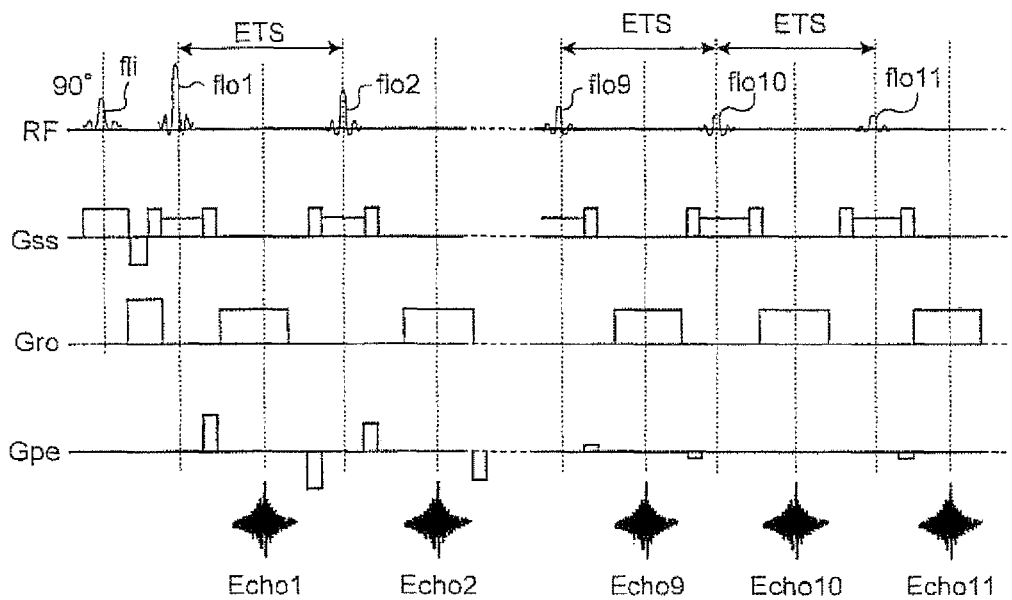
FIG. 3 is a diagram illustrating a pulse sequence for a main scan according to the first embodiment.

FIG. 3 is a diagram illustrating the pulse sequence for a main scan according to the first embodiment. In FIG. 3, "RF" indicates the application timing of a flip pulse for excitation and a flop pulse for refocus. In addition, "Gss" indicates the application timing and intensity of the slice selection gradient magnetic field, "Gro" indicates the application timing and intensity of the readout gradient magnetic field, and "Gpe" indicates the application timing and intensity of the phase encoding gradient magnetic field. FIG. 3 shows only a pulse sequence related to the selection of one slice, but does not show slice encoding. In addition, "ETS (Echo Train Spacing)" indicates an echo interval.

As shown in FIG. 3, the pulse sequence for a main scan is a pulse sequence of a general FSE method. As shown in FIG. 3, in the pulse sequence for a main scan, after a flip pulse fli is applied, a plurality of flop pulses flo1, flo2, . . . , flo9, flo10, flo11, . . . are sequentially applied to collect a plurality of echo signals Echo1, Echo2, . . . , Echo9, Echo10, Echo11, . . . . The pulse sequence shown in FIG. 3 is an example in which the phase encoding gradient magnetic field is set to zero at the tenth collected echo signal Echo10.

Figure 4:
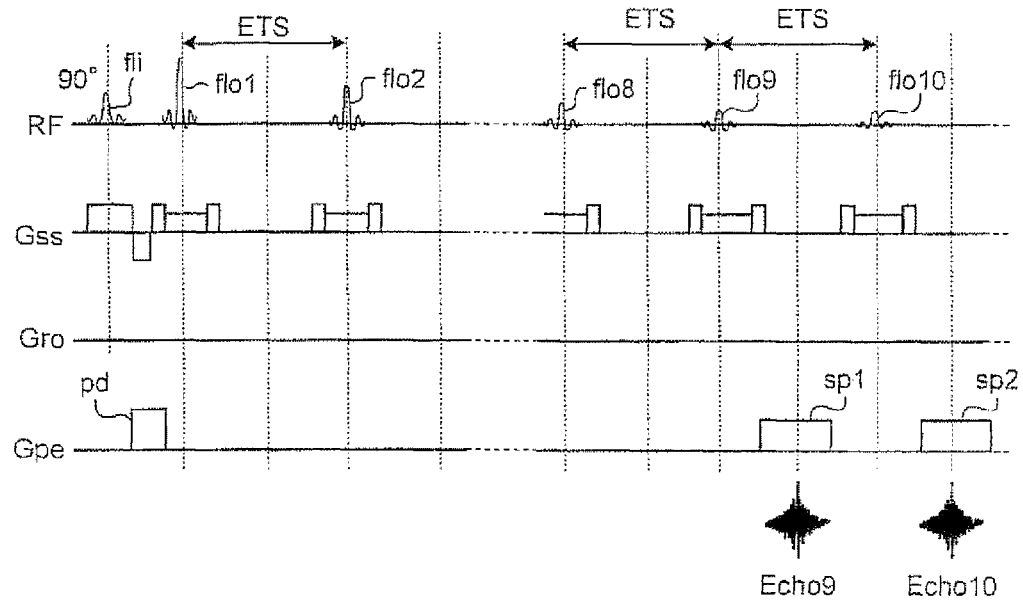
FIG. 4 is a diagram illustrating a first pulse sequence for a first pre-scan according to the first embodiment.

FIG. 4 is a diagram illustrating the first pulse sequence for a first pre-scan according to the first embodiment. As shown in FIG. 4, the first pulse sequence for a first pre-scan is set such that the readout gradient magnetic field and the phase encoding gradient magnetic field are not applied, but a plurality of sampling gradient magnetic fields are applied in the phase encoding direction in the pulse sequence for the main scan shown in FIG. 3.

In the first pulse sequence, the sampling gradient magnetic field is applied after the odd-numbered echo signal collected during the same period as that for which the phase encoding gradient magnetic field is zero in the main scan or in the vicinity of the period. For example, as shown in FIG. 3, the pulse sequence is set such that the phase encoding gradient magnetic field is zero at the tenth collected echo signal in the main scan. In this case, as shown in FIG. 4, the first pulse sequence is set such that a sampling gradient magnetic field sp1 is applied at the ninth echo signal Echo9 and a sampling gradient magnetic field sp2 is applied at the tenth echo signal Echo10.

In the first pulse sequence, a pre-dephasing gradient magnetic field pd is applied between the flip pulse fli and the first flop pulse flo1 such that an echo signal is collected from the ninth echo signal Echo9. In addition, the first pulse sequence is set such that a stimulated echo is cancelled and only a spin echo is collected. For example, the method disclosed in U.S.

Pat. No. 5,818,229 may be used. In the method, an echo signal corresponding to a first shot that is collected while the phase of the flop pulse for refocus is changed to π, π, π, π, . . . is added to an echo signal corresponding to a second shot that is collected while the phase of the flop pulse for refocus is changed to π, −π, π, −π, . . . to extract only a spin echo component. Alternatively, the echo signal corresponding to the second shot may be subtracted from the echo signal corresponding to the first shot to extract only a stimulated echo component and the extracted stimulated echo component may be used instead of the spin echo component.

Figure 5:
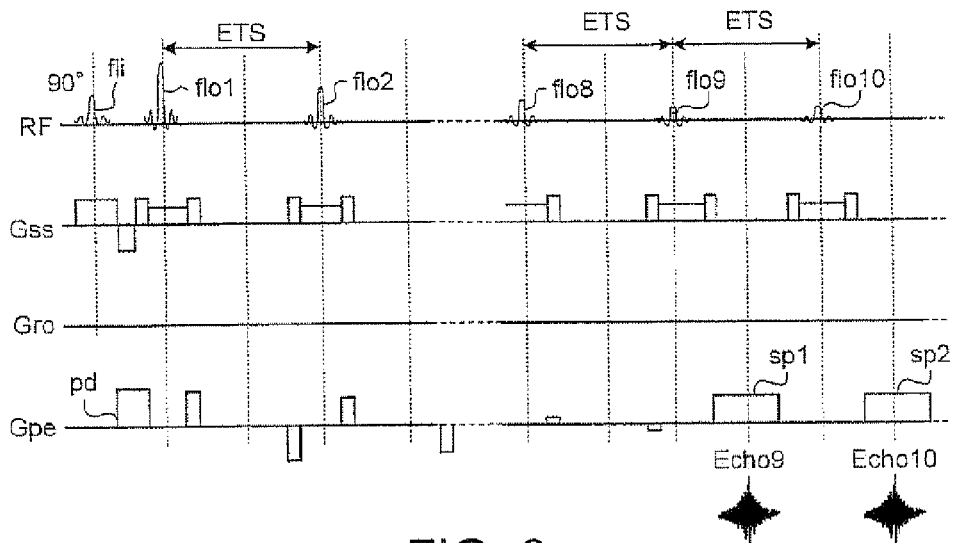
FIG. 5 is a diagram illustrating a second pulse sequence for a second pre-scan according to the first embodiment.

FIG. 5 is a diagram illustrating the second pulse sequence for a second pre-scan according to the first embodiment. As shown in FIG. 5, the second pulse sequence for a second pre-scan is set such that the sampling gradient magnetic field is applied at the same echo signal as that in the first pulse sequence shown in FIG. 4 and a representative phase encoding gradient magnetic field among the phase encoding gradient magnetic fields which are applied in the pulse sequence for a main scan is applied.

In the second pulse sequence, the sampling gradient magnetic field is applied at the same echo signal as that in the first pulse sequence, and a representative phase encoding gradient magnetic field among the phase encoding gradient magnetic fields applied in the pulse sequence for a main scan is applied up to an even-numbered echo before the sampling gradient magnetic field is applied. For example, as shown in FIG. 4, it is assumed that the first pulse sequence is set such that the sampling gradient magnetic field is applied after the ninth echo signal. In this case, as shown in FIG. 5, the second pulse sequence is set such that a representative phase encoding gradient magnetic field among the phase encoding gradient magnetic fields applied in the pulse sequence for a main scan is applied up to the eighth echo signal.

For example, the second pulse sequence is set such that the phase encoding gradient magnetic field in the vicinity of average intensity among a plurality of phase encoding gradient magnetic fields used in the pulse sequence for a main scan is applied. For example, when a phase encoding matrix is 256 and 19 echoes are collected, 13 shots (=256/19) are required to fill up k-space. In this case, the second pulse sequence is set such that the phase encoding gradient magnetic field which is applied by a shot with the average intensity of the phase encoding gradient magnetic field (a center shot (seventh shot) when the phase encoding gradient magnetic field is sequentially filled up) is applied.

For sampling pitches for the first and second pre-scan and a sampling imaging region, it is preferable that the center of the imaging region be aligned with the center of an imaging region in the phase encoding direction of the main scan, and the sampling pitch and the imaging region may be the same as or different from those in the main scan. However, it is preferable that the larger one of the imaging region in the phase encoding direction of the main scan and the imaging region of the readout direction of the main scan be used as the imaging region of the pre-scan in terms of collection and processing.

In FIGS. 4 and 5, the pre-dephasing gradient magnetic field and the sampling gradient magnetic field are applied in the same way as that in the main scan. However, as long as echoes can be collected, the magnetic fields may be applied in different ways. For example, the pre-dephasing gradient magnetic field may be removed and a gradient magnetic field with a reverse sign may be applied in half the area of sp1 and sp2 before and after sp1 and sp2.

When the gradient magnetic field in the readout direction of the main scan is a flow compensation type, the sampling gradient magnetic field in the pulse sequence for pre-scan may not be a flow compensation type in order to collect the phase difference according to whether there is a phase encode.

Returning to FIG. 2, the pre-scan executing unit 26b executes each of the first pre-scan using the first pulse sequence and the second pre-scan using the second pulse sequence.

Specifically, when the imaging condition setting unit 26a generates sequence execution data for the first pre-scan and sequence execution data for the second pre-scan, the pre-scan executing unit 26b reads the first sequence execution data from the sequence execution data storage unit 23a. Then, the pre-scan executing unit 26b transmits the read first sequence execution data to the sequence control unit 10 through the interface unit 21, thereby executing the first pre-scan. For example, the pre-scan executing unit 26b transmits the sequence execution data defining the pulse sequence shown in FIG. 4 to the sequence control unit 10, thereby performing the first pre-scan.

After the first pre-scan ends, the pre-scan executing unit 26b reads the second sequence execution data from the sequence execution data storage unit 23a and transmits the read second sequence execution data to the sequence control unit 10 through the interface unit 21, thereby performing the second pre-scan. For example, the pre-scan executing unit 26b transmits the sequence execution data defining the pulse sequence shown in FIG. 5 to the sequence control unit 10, thereby performing the second pre-scan.

The pre-scan executing unit 26b may execute the second pre-scan prior to the first pre-scan.

The correction amount calculating unit 26c calculates as the amount of correction the amount of phase difference which occurs in the phase encoding direction by the phase encoding gradient magnetic field from the phase difference between a plurality of echo signals collected by the first pre-scan and the phase difference between a plurality of echo signals collected by the second pre-scan.

Specifically, after pre-scan executing unit 26b executes the first pre-scan and the second pre-scan, correction amount calculating unit 26c reads the MR signal data related to the echo signals which are collected by the first and second pre-scans from MR signal data storage unit 23b. Then, correction amount calculating unit 26c performs a Fourier transformation on each of the read MR signal data items in the phase encoding direction to calculate a first-order phase difference. In addition, correction amount calculating unit 26c corrects the first-order phase of each echo signal using the calculated first-order phase difference and calculates the phase average of each echo signal, thereby calculating a zero-order phase difference. In this case, it is preferable that the phase difference be calculated in the imaging region in the phase encoding direction which is designated by the user. For example, when the imaging region in the readout direction of the main scan is 25 cm, the imaging region in the phase encoding direction is 20 cm, and the imaging region in the pre-scan is 25 cm, the phase difference may be calculated in a region of 20 cm.

In the FSE method, the amount of dephasing generated by the phase encoding gradient magnetic field which is applied for the previously generated echo signal is added to the next echo signal to generate a phase difference in the echo that will be observed in the next stage. The phase difference is called a first-order phase difference since it is related to a linear function of position. The gradient magnetic field includes a zero-order term (B0 component) due to, for example, mismatching between the arrangements of the coils. The zero-order term of the gradient magnetic field is a uniform component that does not depend on position, but has time characteristics in which it falls in an exponential manner such as an overcurrent, which causes a phase difference. The phase difference is referred to as a zero-order phase difference.

The correction amount calculating unit 26c calculates the first-order and zero-order phase differences of the echo signals collected by the first pre-scan and the first-order and zero-order phase differences of the echo signals collected by the second pre-scan. Then, the correction amount calculating unit 26c calculates the difference between the calculated phase differences. The difference is a phase difference occurring in the phase encoding direction by the phase encoding gradient magnetic field.

For example, it is assumed that each of the first pulse sequence shown in FIG. 4 and the second pulse sequence shown in FIG. 5 is performed. In this case, the correction amount calculating unit 26c calculates a phase difference p1 between the ninth echo signal Echo9 and the tenth echo signal Echo10 shown in FIG. 4 and a phase difference p2 between the ninth echo signal Echo9 and the tenth echo signal Echo10 shown in FIG. 5. Then, the correction amount calculating unit 26c calculates the phase difference p2−p1 occurring in the phase encoding direction by the phase encoding gradient magnetic field as the amount of correction.

In this embodiment, the correction amount calculating unit 26c uses the ninth echo signal and the tenth echo signal to calculate the amount of correction. However, the correction amount calculating unit 26c may use the eleventh and subsequent echo signals. For example, the correction amount calculating unit 26c may calculate the phase difference p1 between the ninth and tenth echo signals, the phase difference p1_2 between the eleventh and tenth echo signals, and the phase difference p1_3 between the eleventh and twelfth echo signals in the first pulse sequence, and calculate the phase difference p2 between the ninth and tenth echo signals, the phase difference p2_2 between the eleventh and tenth echo signals, and the phase difference p2_3 between the eleventh and twelfth echo signals in the second pulse sequence. Then, the correction amount calculating unit 26c may calculate a phase difference (p2+p2_2+p2_3)/3−(p1+p1_2+p1_3)/3 which occurs in the phase encoding direction by the phase encoding gradient magnetic field.

The sequence correcting unit 26d corrects the pulse sequence for a main scan on the basis of the phase difference calculated by correction amount calculating unit 26c. Specifically, when correction amount calculating unit 26c calculates the phase difference, sequence correcting unit 26d corrects the sequence execution data for a main scan which is stored in sequence execution data storage unit 23a on the basis of the calculated phase difference.

In this case, the sequence correcting unit 26d corrects the pulse sequence for the main scan such that the phase difference calculated by correction amount calculating unit 26c is zero. In this case, for example, sequence correcting unit 26d changes the pulse sequence for the main scan such that a correction gradient magnetic field is applied between the flip pulse and the flop pulse for the first-order phase difference. In addition, the sequence correcting unit 26d may change the intensity of a rewind gradient magnetic field or the phase encoding gradient magnetic field in the pulse sequence for the main scan such that the phase difference is zero. For example, for the first-order phase difference, the sequence correcting unit 26d changes the phase of the flop pulse such that the phase difference is zero.

As such, since the sequence correcting unit 26d corrects the pulse sequence for the main scan such that the phase difference occurring in the phase encoding direction by the phase encoding gradient magnetic field is zero, it is possible to obtain an image that is not affected by an overcurrent due to the phase encoding gradient magnetic field.

Figure 6:
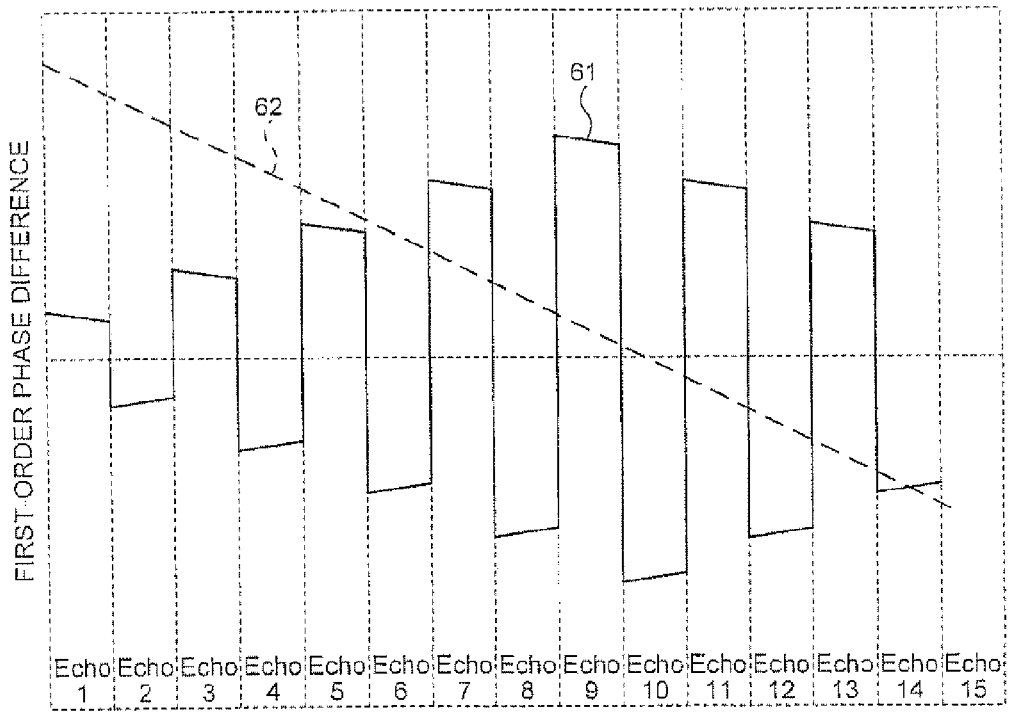
FIGS. 6 and 7 are diagrams illustrating the correction of a phase difference by a sequence correcting unit according to the first embodiment.
Figure 7:
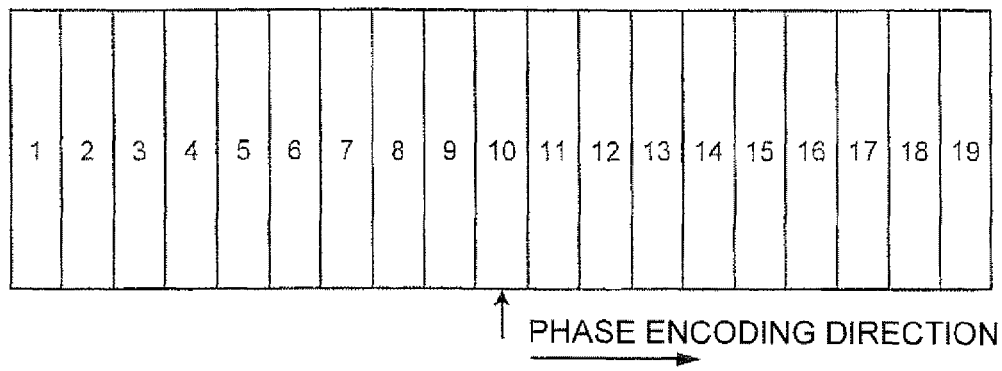

FIGS. 6 and 7 are diagrams illustrating correction of the phase difference by the sequence correcting unit 26d according to the first embodiment. FIG. 6 shows an example of the phase difference in the phase encoding direction. In FIG. 6, a solid line 61 indicates a first-order (or zero-order) phase difference in the phase encoding direction for each echo signal and a dashed line 62 indicates the intensity of the phase encoding gradient magnetic field. FIG. 7 shows k-space in which the echo signals shown in FIG. 6 are arranged. In FIG. 7, the horizontal axis indicates the phase encoding direction.

The first-order (or zero-order) phase difference in the phase encoding direction depends on a method of arranging the echo signals in k-space. FIG. 6 shows an example in which the collected echo signals are arranged in regular order in the phase encoding direction in k-space. FIG. 7 shows the order of the collected echo signals. When a pre-scan is performed using the pulse sequences shown in FIGS. 4 and 5, the first-order phase difference of the echo signal which is arranged at a position corresponding to the tenth collected echo signal Echo10 (position indicated by an arrow in FIG. 7), that is, in the vicinity of the center of k-space is corrected. In this embodiment, correction is performed on the basis of the tenth collected echo signal Echo10. However, any even-numbered collected echo signal may be used as the reference echo signal.

The main scan executing unit 26e executes the main scan using the pulse sequence for a main scan which is corrected by sequence correcting unit 26d. Specifically, when sequence correcting unit 26d corrects the sequence execution data for a main scan, pre-scan executing unit 26b reads the corrected sequence execution data from sequence execution data storage unit 23a. Then, main scan executing unit 26e transmits the read sequence execution data to sequence control unit 10 through interface unit 21, thereby performing the main scan.

Figure 8:
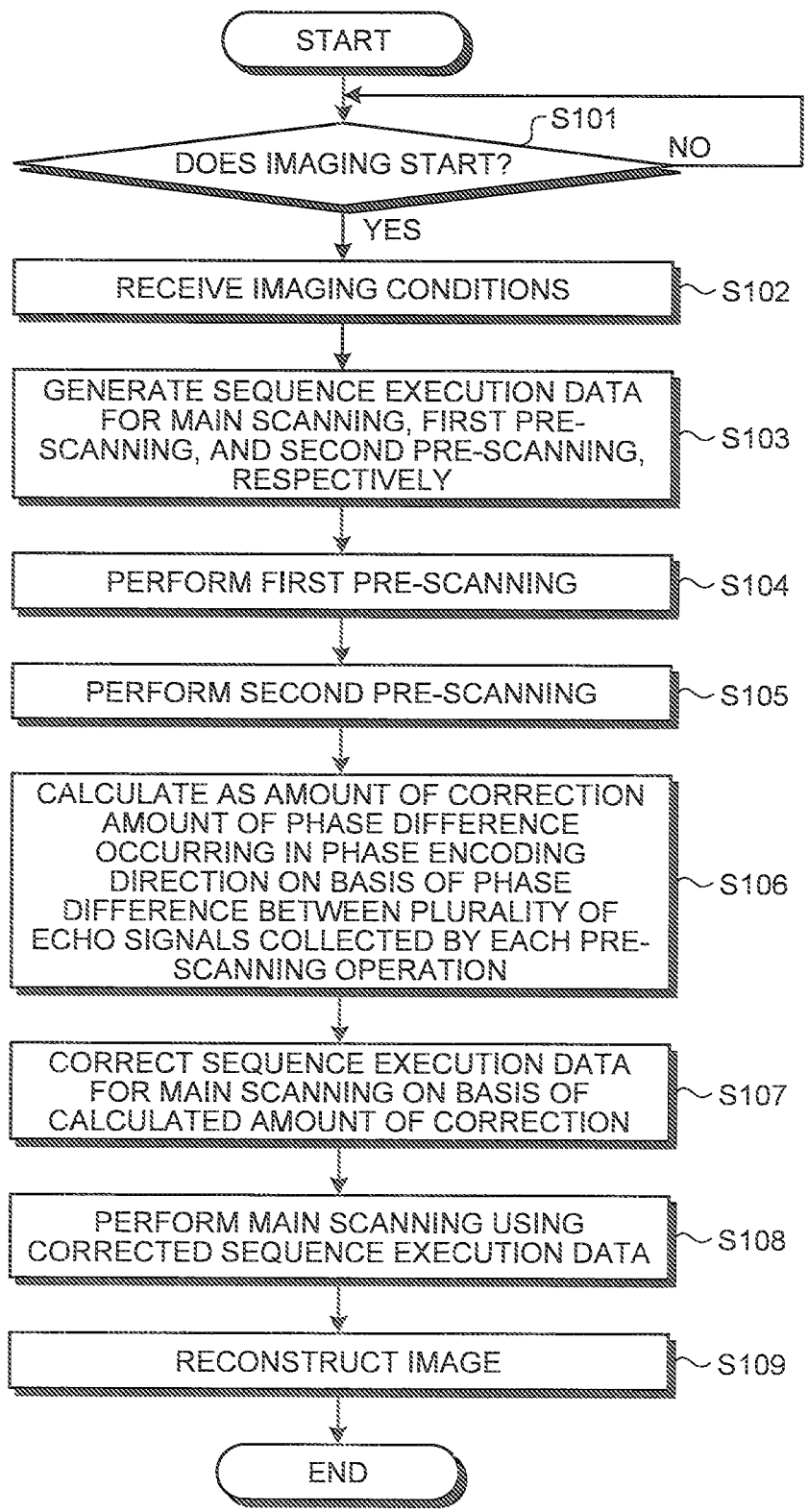
FIG. 8 is a flowchart illustrating a phase difference correcting process of the MRI apparatus according to the first embodiment.

Next, a phase difference correcting process of MRI apparatus 100 according to the first embodiment will be described. FIG. 8 is a flowchart illustrating the phase difference correcting process of MRI apparatus 100 according to the first embodiment.

As shown in FIG. 8, in MRI apparatus 100 according to the first embodiment, when the operator inputs an instruction to start an image capture operation (Step S101: Yes), imaging condition setting unit 26a receives the imaging conditions input by the operator through input unit 24 (Step S102).

Then, imaging condition setting unit 26a generates sequence execution data for a main scan, sequence execution data for a first pre-scan, and sequence execution data for a second pre-scan on the basis of the imaging conditions input by the operator (Step S103).

For example, imaging condition setting unit 26a generates sequence execution data defining the pulse sequence shown in FIG. 3 as the sequence execution data for the main scan. In addition, for example, imaging condition setting unit 26a generates sequence execution data defining the first pulse sequence shown in FIG. 4 as the sequence execution data for the first pre-scan. For example, imaging condition setting unit 26a generates sequence execution data defining the second pulse sequence shown in FIG. 5 as the sequence execution data for the second pre-scan.

Then, pre-scan executing unit 26b executes the first pre-scan on the basis of the sequence execution data of the first pulse sequence generated by imaging condition setting unit 26a (Step S104). Then, pre-scan executing unit 26b executes the second pre-scan on the basis of the sequence execution data of the second pulse sequence generated by imaging condition setting unit 26a (Step S105).

Then, correction amount calculating unit 26c calculates the amount of phase difference occurring in the phase encoding direction as the amount of correction from the phase differences between a plurality of echo signals collected by the first and second pre-scan operations (Step S106). Then, sequence correcting unit 26d corrects the sequence execution data for the main scan on the basis of the amount of correction calculated by correction amount calculating unit 26c (Step S107).

Then, main scan executing unit 26e executes the main scan on the basis of the sequence execution data for the main scan which is corrected by sequence correcting unit 26d (Step S108). Then, image reconstruction unit 22 reconstructs an image from the MR signal data collected by the main scan (Step S109).

In this embodiment, the first pre-scan and the second pre-scan are performed in this order. However, the order of the first pre-scan and the second pre-scan may be reversed.

Figure 9:
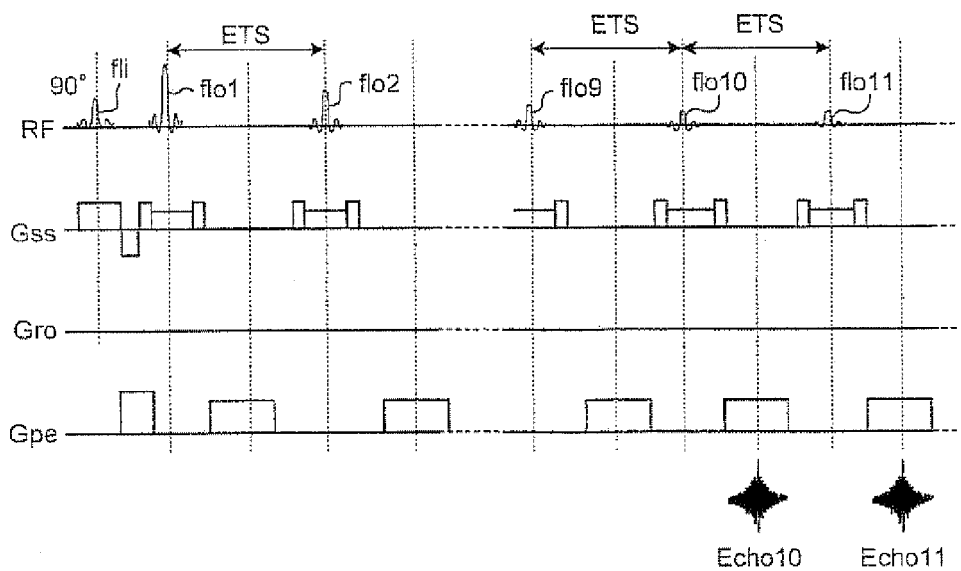
FIG. 9 is a diagram illustrating a modification of the first pulse sequence for first pre-scan according to the first embodiment.

FIG. 9 is a diagram illustrating a modification of the first pulse sequence for the first pre-scan according to the first embodiment. As shown in FIG. 9, the first pulse sequence for the first pre-scan is set such that the readout gradient magnetic field and the phase encoding gradient magnetic field are not applied and a sampling gradient magnetic field which is similar to the readout gradient magnetic field used in the main scan is applied in the phase encoding direction in the pulse sequence for the main scan shown in FIG. 3.

Figure 10:
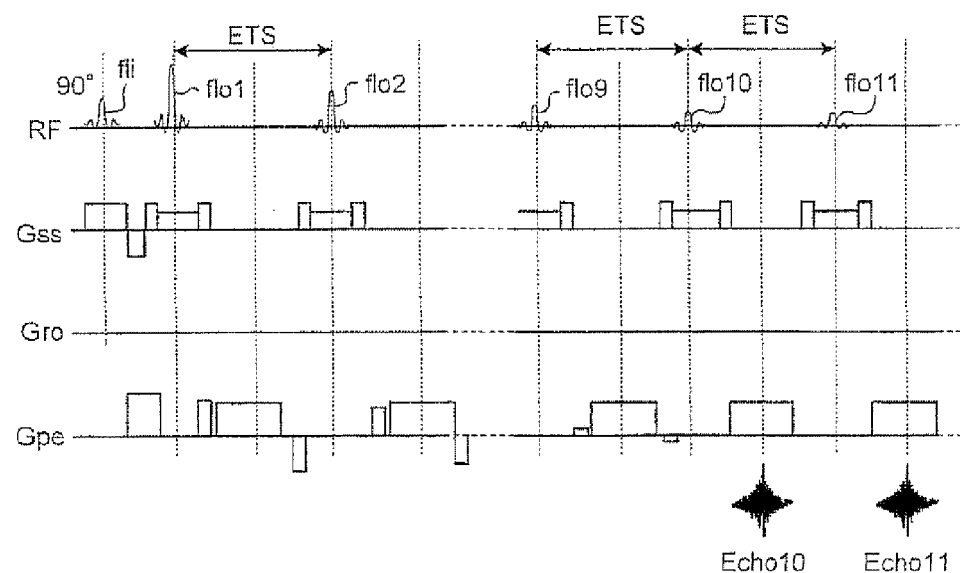
FIG. 10 is a diagram illustrating a modification of the second pulse sequence for second pre-scan according to the first embodiment.

FIG. 10 is a diagram illustrating a modification of the second pulse sequence for a second pre-scan according to the first embodiment. As shown in FIG. 10, the second pulse sequence for a second pre-scan is set such that a representative phase encoding gradient magnetic field among the phase encoding gradient magnetic fields applied in the pulse sequence for a main scan is applied in the first pulse sequence shown in FIG. 9.

In FIGS. 9 and 10, unlike the pulse sequences shown in FIGS. 4 and 5, the sampling gradient magnetic field is applied for each echo signal. Therefore, the echo signal where the phase encoding gradient magnetic field is applied is not limited to an even-numbered echo signal. In FIG. 10, the phase encoding gradient magnetic field is applied up to the ninth echo signal. However, in practice, in many cases, the falling edge of a phase encoding portion and the rising edge of a sampling portion are continuous. Therefore, the pulse sequences shown in FIGS. 4 and 5 are preferable in order to accurately measure the deviation of overcurrent due to the phase encoding gradient magnetic field.

As described above, in the first embodiment, the pre-scan executing unit 26b executes the first pre-scan using the first pulse sequence and the second pre-scan using the second pulse sequence. In the first pre-scan, the readout gradient magnetic field and the phase encoding gradient magnetic field are not applied and a plurality of sampling gradient magnetic fields are applied in the phase encoding direction. In the second pulse sequence, the readout gradient magnetic field is not applied, the sampling gradient magnetic field is applied at the same echo signal as that in the first pulse sequence, and a representative phase encoding gradient magnetic field among the phase encoding gradient magnetic fields applied in the pulse sequence for the main scan is applied. The correction amount calculating unit 26c calculates as the amount of correction the phase difference occurring in the phase encoding direction by the phase encoding gradient magnetic field from the phase difference between a plurality of echo signals collected by the first pre-scan and the phase difference between a plurality of echo signals collected by the second pre-scan.

The sequence correcting unit 26d corrects the pulse sequence for the main scan on the basis of the amount of correction calculated by correction amount calculating unit 26c. Therefore, according to the first embodiment, it is possible to prevent the deterioration of image quality due to the phase difference in the phase encoding direction.

In the first embodiment, in the first pulse sequence, the sampling gradient magnetic field is applied after an odd-numbered echo signal collected during the same period as that for which the phase encoding gradient magnetic field is zero in the main scan or in the vicinity of the period. In the second pulse sequence, the sampling gradient magnetic field is applied at the same echo signal as that in the first pulse sequence, and a representative phase encoding gradient magnetic field among the phase encoding gradient magnetic fields which are applied in the pulse sequence for a main scan is applied before the sampling gradient magnetic field is applied. Therefore, according to the first embodiment, the phase difference of the echo signal which is arranged in the vicinity of the center of k-space that most greatly contributes to image quality is corrected. Therefore, it is possible to improve the quality of the image formed by MRI apparatus 100.

As a modification of the first embodiment, the pre-scan executing unit 26b may apply the phase encoding gradient magnetic field of a shot where the maximum phase encoding gradient magnetic field is applied at the first echo signal among a plurality of shots as the second pre-scan and may apply the phase encode gradient magnetic field of a shot where the minimum phase encoding gradient magnetic field is applied at the first echo signal as the third pre-scan.

Figure 11:
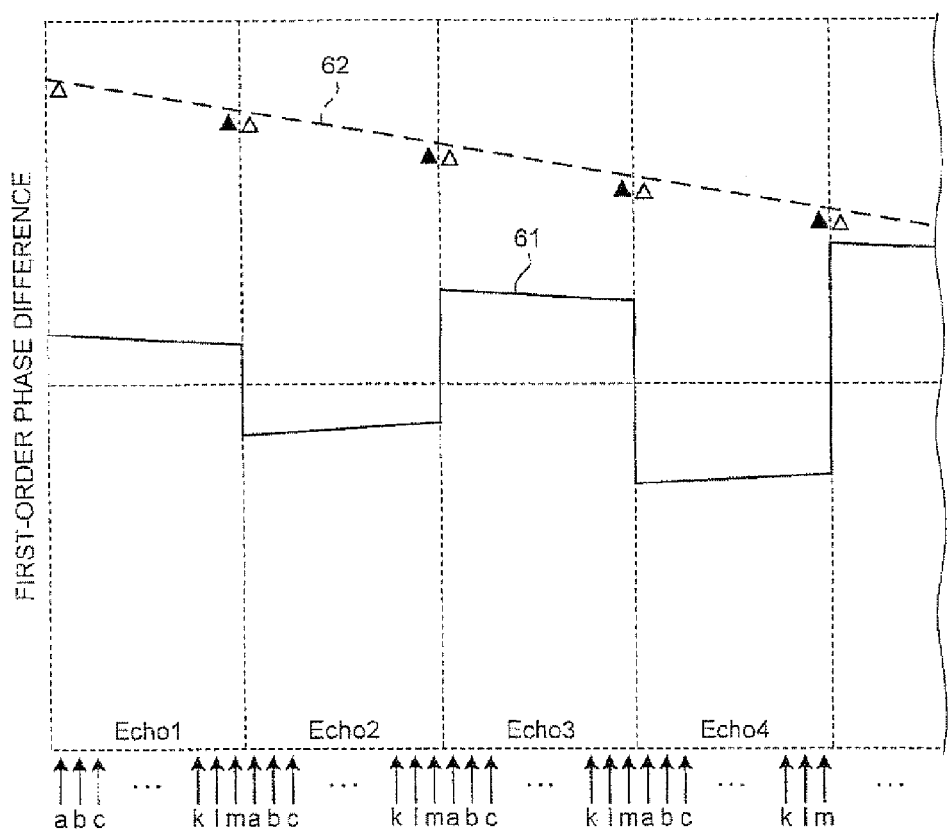
FIG. 11 is a diagram illustrating a modification of a first embodiment.

FIG. 11 is a diagram illustrating a modification of the first embodiment. FIG. 11 shows the phase difference from the first echo signal (Echo1) to the fourth echo signal (Echo4) among the phase differences in the phase encoding direction shown in FIG. 6. Similar to FIG. 6, a solid line 61 indicates the first-order (or zero-order) phase difference of each echo signal in the phase encoding direction and a dashed line 62 indicates the intensity of the phase encoding gradient magnetic field.

For example, FIG. 11 shows an example in which a plurality of shots a, b, c, . . . , k, l, and m are used. In addition, for example, as shown in FIG. 11, it is assumed that, among the plurality of shots a, b, c, . . . , k, l, and m, in the first echo signal (Echo1), the maximum phase encoding gradient magnetic field is applied at shot a and the minimum phase encoding gradient magnetic field is applied at shot m. In this case, pre-scan executing unit 26b applies the phase encoding gradient magnetic field (see a hollow triangular mark shown in FIG. 11) of shot a as the second pre-scan and applies the phase encoding gradient magnetic field (see a solid black triangular mark shown in FIG. 11) of shot m as the third pre-scan.

In this case, for example, when the phase difference in the first pre-scan is p1, the phase difference in the second pre-scan is p2, and the phase difference in the third pre-scan is p3, the correction amount calculating unit 26c may calculate the amount of correction for the shots between the first and last shots by interpolation, using p2−p1 as the amount of correction for the shot where the maximum phase encoding gradient magnetic field is applied and p3−p1 as the amount of correction for the shot where the minimum phase encoding gradient magnetic field is applied. Specifically, when the maximum phase encoding gradient magnetic field is applied at the first shot and the number of shots is N, the amount of correction for the shot where the i-th largest phase encoding gradient magnetic field is applied is p2−p1+(p3−p2)*(i−1)/(N−1).

In the first embodiment, the phase difference of the echo signal that is arranged in the vicinity of the center of k-space is corrected. However, MRI apparatus 100 according to the embodiment is not limited thereto. Next, a second embodiment in which the phase differences of a plurality of echo signals are corrected will be described. An MRI apparatus according to the second embodiment has the same basic structure as that according to the first embodiment shown in FIGS. 1 and 2 except for the process of imaging condition setting unit 26a, pre-scan executing unit 26b, correction amount calculating unit 26c, and sequence correcting unit 26d.

In the second embodiment, imaging condition setting unit 26a generates sequence execution data for a pulse sequence for a third pre-scan, which will be described below, in addition to the pulse sequence for a main scan, the first pulse sequence for a first pre-scan, and the second pulse sequence for a second pre-scan.

Figure 12:
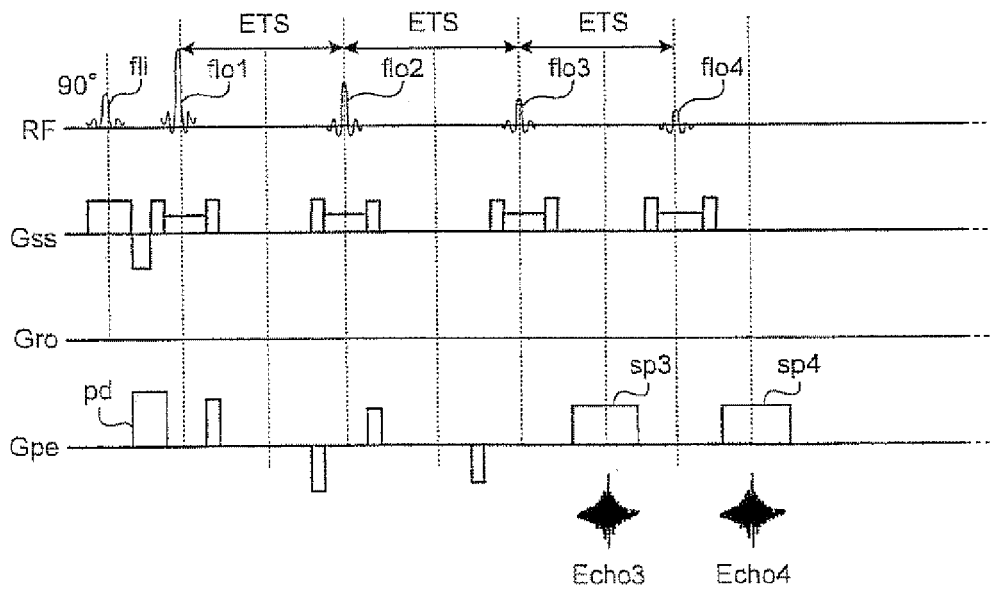
FIG. 12 is a diagram illustrating a third pulse sequence for third pre-scan according to the second embodiment.

FIG. 12 is a diagram illustrating a third pulse sequence for a third pre-scan according to the second embodiment. As shown in FIG. 12, in the third pulse sequence for a third pre-scan, the readout gradient magnetic field is not applied, a plurality of sampling gradient magnetic fields are applied in the phase encoding direction after an odd-numbered echo signal which is collected before another odd-numbered echo signal where the sampling gradient magnetic field starts to be applied in the second pre-scan, and a representative phase encoding gradient magnetic field among the phase encoding gradient magnetic fields which are applied in the pulse sequence for the main scan is applied before the sampling gradient magnetic field is applied.

For example, as shown in FIG. 5, the second pulse sequence is set such that the sampling gradient magnetic field is applied after the ninth echo signal Echo9. In this case, as shown in FIG. 12, for example, the third pulse sequence is set such that a sampling gradient magnetic field sp3 is applied at the third echo signal Echo3 and a sampling gradient magnetic field sp4 is applied at the fourth echo signal Echo4.

In the second embodiment, the pre-scan executing unit 26b executes the third pre-scan using the third pulse sequence shown in FIG. 10, in addition to the first pre-scan and the second pre-scan.

In the second embodiment, the correction amount calculating unit 26c calculates a first phase difference from the phase difference between a plurality of echo signals collected by the first pre-scan and the phase difference between a plurality of echo signals collected by the second pre-scan. In addition, the correction amount calculating unit 26c calculates a second phase difference from the phase difference between the plurality of echo signals collected by the first pre-scan and the phase difference between a plurality of echo signals collected by the third pre-scan. Then, the correction amount calculating unit 26c calculates the amount of correction for a plurality of echo signals from the calculated first phase difference and second phase difference.

For example, it is assumed that each of the first pulse sequence shown in FIG. 4, the second pulse sequence shown in FIG. 5, and the third pulse sequence shown in FIG. 12 is executed. In this case, the correction amount calculating unit 26c calculates the phase difference p1 between the ninth echo signal Echo9 and the tenth echo signal Echo10 shown in FIG. 4, the phase difference p2 between the ninth echo signal Echo9 and the tenth echo signal Echo10 shown in FIG. 5, and the phase difference p3 between the third echo signal Echo3 and the fourth echo signal Echo4 shown in FIG. 12.

Further, the correction amount calculating unit 26c calculates p2-p1 as the first phase difference. In addition, the correction amount calculating unit 26c calculates p3-p1 as the second phase difference. The first phase difference p2-p1 is a phase difference dif9 of the ninth echo signal Echo9. The second phase difference p3-p1 is a phase difference dif3 of the third echo signal Echo3.

Then, the correction amount calculating unit 26c calculates the amount of correction for the echo signals other than the third and ninth echo signals from the first phase difference and the second phase difference. For example, in the main scan, when the phase encoding gradient magnetic field is zero at the tenth collected echo signal Echo10, the phase difference of the echo signal gradually increases up to the echo signal Echo10 and is gradually reduced after the echo signal Echo10. For example, it may be assumed that a phase difference dif15 of the fifteenth echo signal is equal to the phase difference dif3 of the third echo signal Echo3.

The correction amount calculating unit 26c estimates the phase difference of the echo signals collected before the echo signal where the phase encoding gradient magnetic field is zero from the phase difference of the echo signals collected after the echo signal where the phase encoding gradient magnetic field is zero in the main scan. In addition, the correction amount calculating unit 26c linearly interpolates the calculated phase differences of each echo signal to calculate the phase differences of a plurality of echo signals.

Figure 13:
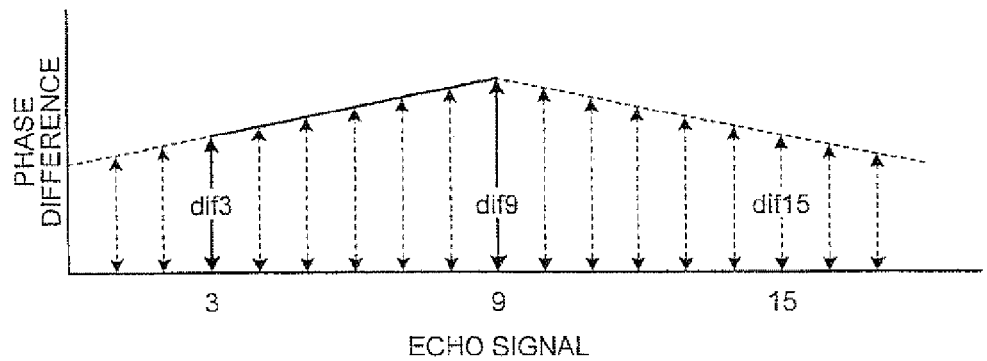
FIG. 13 is a diagram illustrating the calculation of a phase difference by a sequence correcting unit according to the second embodiment.

FIG. 13 is a diagram illustrating the calculation of the phase difference by the sequence correcting unit 26d according to the second embodiment. As shown in FIG. 13, for example, the sequence correcting unit 26d estimates the phase difference dif15 of the fifteenth echo signal Echo15 from the phase difference dif3 of the third echo signal Echo3 on the basis of the ninth echo signal Echo9. Then, the correction amount calculating unit 26c linearly interpolates the phase difference dif3 of the echo signal Echo3, the phase difference dif9 of the echo signal Echo9, and the phase difference dif15 of the echo signal Echo15 to calculate the phase differences of a plurality of echo signals.

In the second embodiment, for the first-order phase difference, sequence correcting unit 26d corrects the intensity of the gradient magnetic field applied in the phase encoding direction to each echo signal in the pulse sequence for a main scan, on the basis of the phase difference calculated by correction amount calculating unit 26c. In this case, for example, sequence correcting unit 26d changes the intensity of the phase encoding gradient magnetic field applied at each echo signal such that the phase difference of each echo signal is zero. Alternatively, sequence correcting unit 26d may change the intensity of the rewind gradient magnetic field such that the phase difference of each echo signal is zero. In addition, for example, sequence correcting unit 26d changes the phase of the flop pulse such that the phase difference is zero, for the zero-order phase difference.

As described above, in the second embodiment, pre-scan executing unit 26b further executes the third pre-scan using the third pulse sequence in which the readout gradient magnetic field is not applied, a plurality of sampling gradient magnetic fields are applied in the phase encoding direction after an odd-numbered echo signal that is collected before another odd-numbered echo signal where the sampling gradient magnetic field starts to be applied in the second pre-sampling, and a representative phase encoding gradient magnetic field among the phase encoding gradient magnetic fields that are applied in the pulse sequence for a main scan is applied before the sampling gradient magnetic field is applied. In addition, correction amount calculating unit 26c calculates the first phase difference from the phase difference between a plurality of echo signals collected by the first pre-scan and the phase difference between a plurality of echo signals collected by the second pre-scan, calculates the second phase difference from the phase difference between a plurality of echo signals collected by the first pre-scan and the phase difference between a plurality of echo signals collected by the third pre-scan, and calculates the phase differences of a plurality of echo signals from the calculated first phase difference and second phase difference. Then, sequence correcting unit 26d corrects the pulse sequence for a main scan on the basis of the phase difference which is calculated for each echo signal by correction amount calculating unit 26c. Therefore, according to the second embodiment, since the phase difference of each echo signal collected by the main scan is corrected, it is possible to prevent the deterioration of image quality due to the phase difference in the phase encoding direction.

In the second embodiment, the phase difference of the echo signals collected after the echo signal where the phase encoding gradient magnetic field is zero in the main scan is estimated from the phase difference of the echo signals collected before the echo signal where the phase encoding gradient magnetic field is zero. However, the first pre-scan may be performed in order to measure the phase difference of the echo signals collected after the echo signal where the phase encoding gradient magnetic field is zero in the main scan. In this case, it is possible to prevent the deterioration of image quality due to the phase difference in the phase encoding direction.

In the first and second embodiments, the echo signals are arranged in the entire k-space by one collecting operation. However, for example, k-space may be divided into a plurality of regions in the phase encoding direction and a plurality of collected echo signals may be classified into groups by a plurality of collecting operations. In this case, the phase difference of each group may be calculated and the pulse sequence for a main scan may be corrected for each group.

Figure 14:
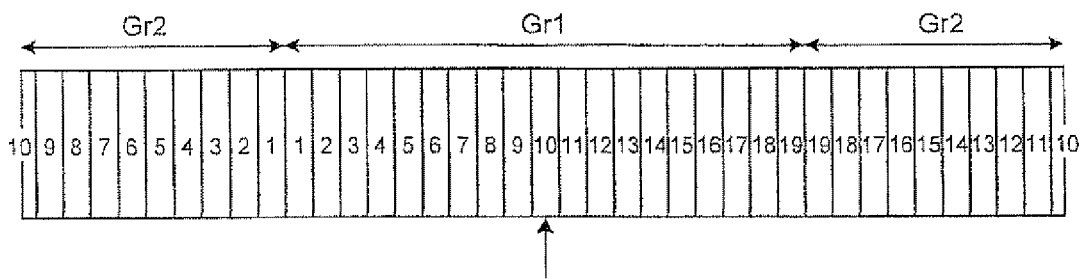
FIG. 14 is a diagram illustrating a modification of the first and second embodiments.

FIG. 14 is a diagram illustrating a modification of the first and second embodiments. FIG. 14 shows an example in which k-space is divided into three regions along the phase encoding direction. In FIG. 14, an arrow indicates the center of k-space. For example, it is assumed that the echo signals are collected and classified into two groups, Gr1 and Gr2. In this case, for example, as shown in FIG. 14, the echo signals in group Gr1 are sequentially arranged in the phase encoding direction in the central region. The first half of the collected echo signals in group Gr2 are sequentially arranged in one of two side regions and the second half of the collected echo signals in group Gr2 are sequentially arranged in the other side region.

In this case, for example, correction amount calculating unit 26c may calculate the amount of correction for each group. In this case, sequence correcting unit 26d corrects the pulse sequence for the main scan for each group. In addition, for example, correction amount calculating unit 26c may calculate the amount of correction for one of the two groups and the sequence correcting unit 26d may correct the pulse sequence for the main scan on the basis of the same amount of correction for all of the groups.

Figure 15:
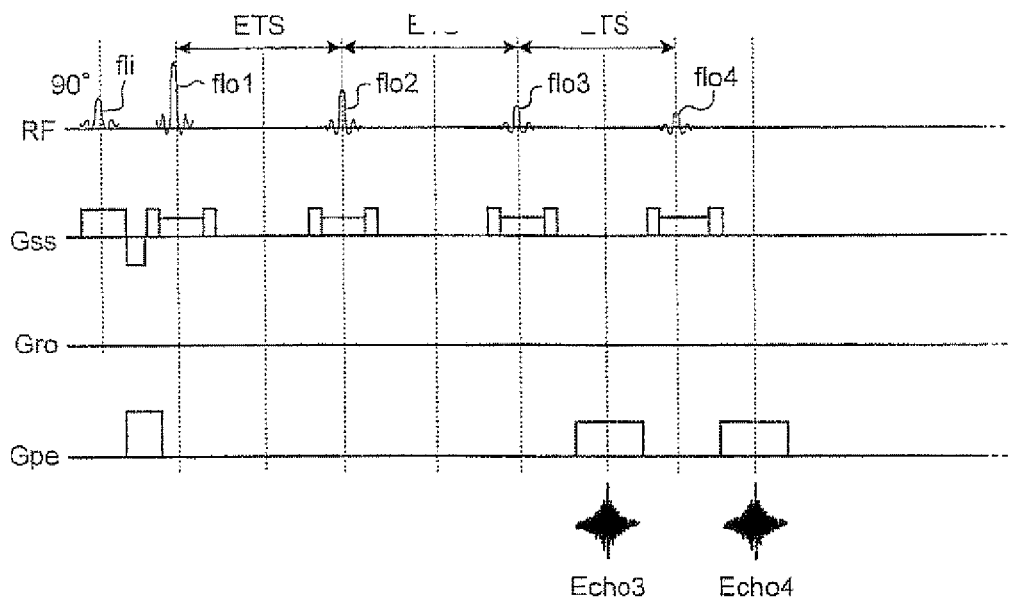
FIG. 15 is a diagram illustrating a first pulse sequence for first pre-scan according to a third embodiment.

Next, as a third embodiment, an example of the collection and correction of echo signals when the first echo signal is at the center of k-space will be described. In the third embodiment, pre-scan executing unit 26b applies the sampling gradient magnetic field after an odd-numbered echo signal in the first pre-scan. FIG. 15 is a diagram illustrating a first pulse sequence for a first pre-scan according to the third embodiment. As shown in FIG. 15, for example, pre-scan executing unit 26b applies the sampling gradient magnetic field from the third echo signal.

Figure 16:
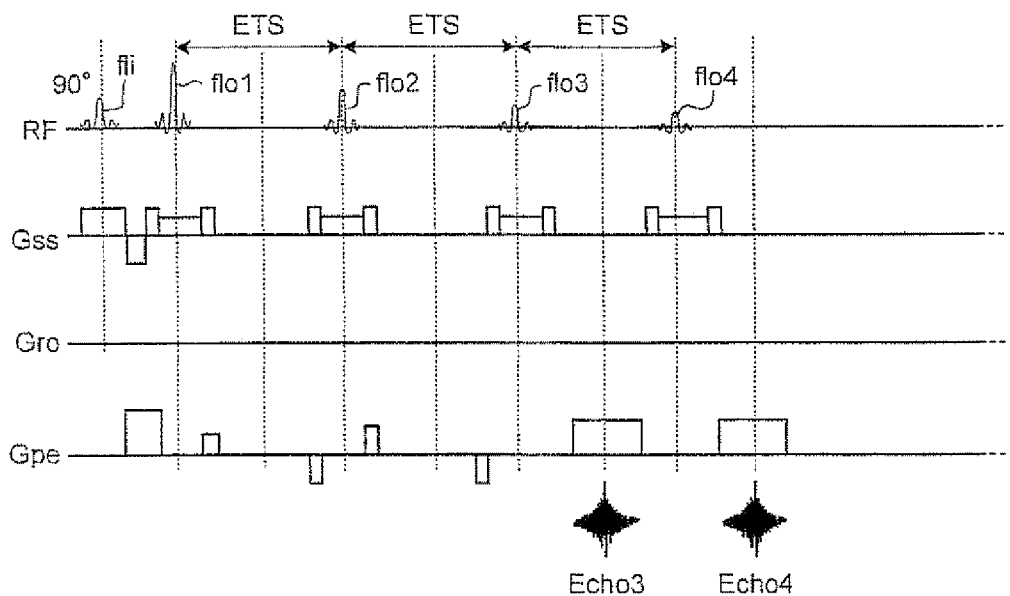
FIG. 16 is a diagram illustrating a second pulse sequence for second pre-scan according to the third embodiment.

In the second pre-scan, pre-scan executing unit 26b applies the sampling gradient magnetic field at the same echo signal as that in the first pulse sequence and applies a representative phase encoding gradient magnetic field among the phase encoding gradient magnetic fields which are applied in the pulse sequence for a main scan before the sampling gradient magnetic field is applied. FIG. 16 is a diagram illustrating a second pulse sequence for second pre-scan according to the third embodiment. As shown in FIG. 16, for example, the pre-scan executing unit 26b applies the phase encoding gradient magnetic field for the first and second echo signals.

Figure 17:
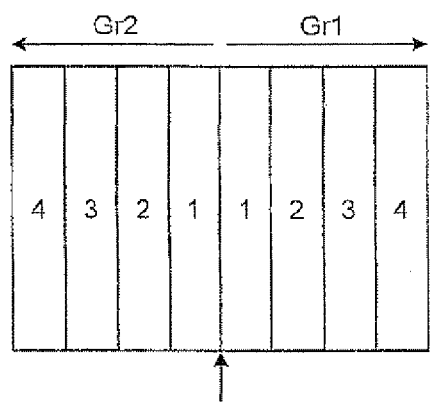
FIG. 17 is a diagram illustrating the collection of echo signals according to the third embodiment.

FIG. 17 is a diagram illustrating the collection of echo signals according to the third embodiment. As shown in FIG. 17, in general, when the first echo signal is at the center of k-space, k-space is divided into two groups, Gr1, Gr2, and the echo signals are collected. In this case, pre-scan executing unit 26b applies a representative phase encoding gradient magnetic field of group Gr1 as the second pre-scan and applies a representative phase encoding gradient magnetic field of group Gr2 as the third pre-scan. The correction amount calculating unit 26c calculates the amount of correction from the phase difference between a plurality of echo signals in each pre-scan operation, similar to the first to third embodiments.

The first to third embodiments can be used together with the pre-scan operation according to the related art that extracts the phase encoding gradient magnetic field. In this way, it is possible to correct the phase difference in all of the readout direction, the slice direction, and the phase encoding direction.

In the pulse sequence used in pre-scan, the gradient magnetic field, such as a pre-pulse used in the main scan, is applied in the same way.

Next, as a fourth embodiment, an example in which the first to third embodiments are used together with a pre-scan operation in which a phase difference due to the slice encoding of a 3D collection sequence is considered will be described. In the fourth embodiment, pre-scan executing unit 26b executes a first pre-scan using a first pulse sequence shown in FIG. 18 and a second pre-scan using a second pulse sequence shown in FIG. 19.

The first pulse sequence is set such that a readout gradient magnetic field, a phase encoding gradient magnetic field, and a slice encoding gradient magnetic field are not applied and a plurality of sampling gradient magnetic fields are applied in the slice encoding direction. The second pulse sequence is set such that the readout gradient magnetic field and the phase encoding gradient magnetic field are not applied, the sampling gradient magnetic field is applied at the same echo signal as that in the first pulse sequence, and a representative slice encoding gradient magnetic field among the slice encoding gradient magnetic fields applied in the pulse sequence for the main scan is applied.

In the fourth embodiment, correction amount calculating unit 26c calculates as the amount of correction a phase difference that occurs in the slice encoding direction by the slice encoding gradient magnetic field, from the phase difference between a plurality of echo signals collected by the first pre-scan and the phase difference between a plurality of echo signals collected by the second pre-scan. The sequence correcting unit 26d corrects the pulse sequence for a main scan for each slice encode on the basis of the amount of correction calculated by correction amount calculating unit 26c. Therefore, according to the fourth embodiment, it is possible to prevent the deterioration of image quality due to a phase difference in the slice encoding direction.

In the fourth embodiment, in the first pulse sequence, the sampling gradient magnetic field is applied after the odd-numbered echo signal collected during the same period as that for which the phase encoding gradient magnetic field is zero in the main scan or in the vicinity of the period. In the second pulse sequence, the sampling gradient magnetic field is applied at the same echo signal as that in the first pulse sequence, and a representative slice encoding gradient magnetic field among the slice encoding gradient magnetic fields which are applied in the pulse sequence for main scan is applied before the sampling gradient magnetic field is applied. Therefore, according to the fourth embodiment, the phase difference of the echo signal which is arranged in the vicinity of the center of the k-space in the phase encoding direction that most greatly contributes to image quality is corrected. Therefore, it is possible to improve the quality of the image formed by the MRI apparatus 100.

For example, when the number of slice encodes (the number of slices) is 64, a slice encode step is −32 to 31. For example, in the second pulse sequence, a slice encode of −32 is applied. When the phase difference (first-order or zero-order) between the echo signals Echo9 and Echo10 in the first pre-scan is s1 and the phase difference between the echo signals Echo9 and Echo10 in the second pre-scan is s2, a phase difference by an i-th slice encode is (s2−s1)*(−i)/32. The first-order phase is corrected by correcting the slice encoding gradient magnetic field and the zero-order phase is corrected by correcting the phase of a 180-degree pulse. In this way, it is possible to correct the phase difference due to the slice encode. In addition, it is possible to improve accuracy by increasing the number of pre-scan operations (for example, by applying a slice encode of +31).

Figure 18:
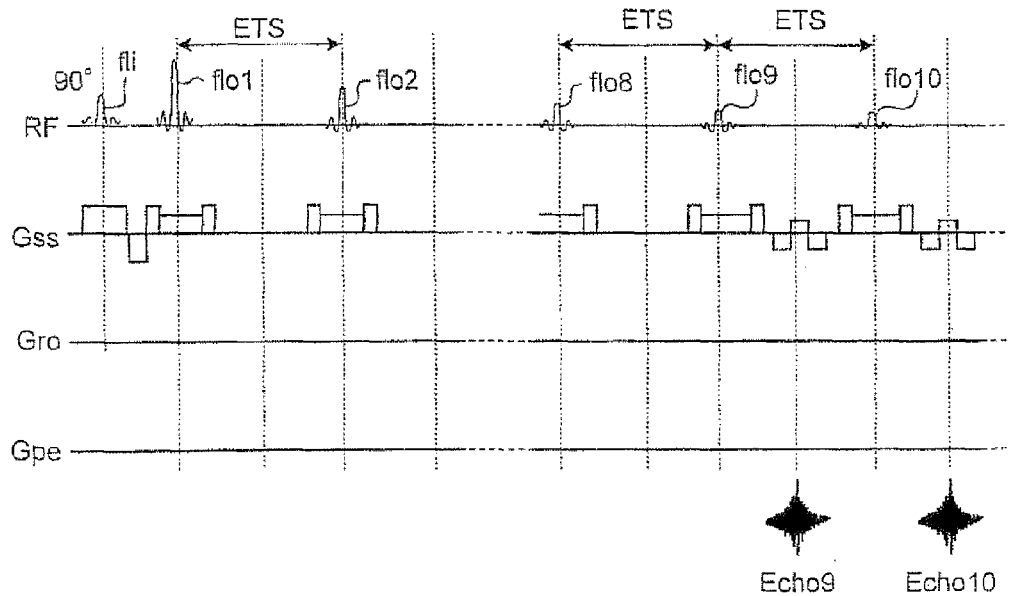
FIG. 18 is a diagram illustrating a first pulse sequence for first pre-scan according to a fourth embodiment.
Figure 19:
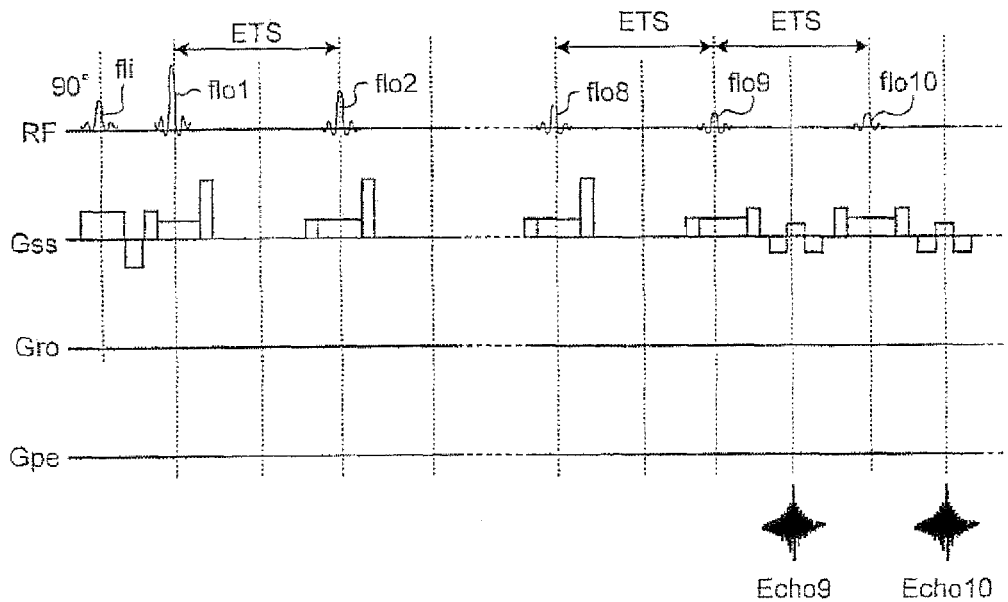
FIG. 19 is a diagram illustrating a second pulse sequence for second pre-scan according to the fourth embodiment.

In addition, it is possible to observe and correct the first-order and zero-order phase differences of the readout gradient magnetic field, the phase encoding gradient magnetic field, and the slice selection gradient magnetic field by combining the first and fourth embodiments and the related art. For example, as the first pre-scan, the pre-scan operation extracting the phase encoding gradient magnetic field according to the related art is performed. As the second pre-scan, the pulse sequence shown in FIG. 4 is performed. As the third pre-scan, the pulse sequence shown in FIG. 5 is performed. As the fourth pre-scan, the pulse sequence shown in FIG. 18 is performed. As the fifth pre-scan, the pulse sequence shown in FIG. 19 is performed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirits of the inventions.

What is claimed is:

1. A magnetic resonance imaging (MRI) apparatus comprising:
    an MRI gantry including static and gradient magnetic field generators, at least one radio frequency (RF) coil coupled to an imaging volume, RF transmitter and RF receiver circuits coupled to said at least one RF coil;
    a magnetic resonance pulse sequence processor; and
    a memory that stores processor-executable instructions that, when executed by the magnetic resonance pulse sequence processor, cause the magnetic resonance pulse sequence processor to:
    execute a first pulse sequence in which no gradient magnetic field is applied in a readout direction, at least one gradient pulse is applied in a phase encoding direction and wherein a plurality of sampling gradient magnetic fields are applied in a phase encoding direction during readout of NMR echo signals, wherein the at least one gradient pulse is either (a) a pre-dephasing gradient magnetic field or (b) gradient magnetic fields applied before and after the sampling gradient magnetic fields;
    execute a second pulse sequence in which no gradient magnetic field is applied in said readout direction wherein the plurality of sampling gradient magnetic fields in said phase encoding direction are applied at the same echo signal locations as those in the first pulse sequence, and representative phase encoding gradient magnetic fields, selected from those among phase encoding gradient magnetic fields applied in a main pulse sequence and used in acquiring an image with the magnetic resonance imaging apparatus, are applied;
    calculate as the amount of correction, the amount of phase difference which occurs in the phase encoding direction as a result of the applied phase encoding gradient magnetic fields, based on a phase difference between a plurality of echo signals collected by the first pulse sequence and a phase difference between a plurality of echo signals collected by the second pulse sequence;
    correct the main pulse sequence on the basis of the calculated amount of correction; and
    execute the corrected main pulse sequence in order to perform phase corrected magnetic resonance imaging with the magnetic resonance imaging apparatus.

2. The magnetic resonance imaging apparatus according to claim 1, wherein,
    in the first pulse sequence the sampling gradient magnetic field is applied after an odd-numbered echo signal which is collected during substantially the same period as that for which the phase encoding gradient magnetic field is zero in the main pulse sequence.

3. The magnetic resonance imaging apparatus according to claim 1, wherein, in the second pulse sequence, phase encoding gradient magnetic fields of substantially average intensity, selected from those among the phase encoding gradient magnetic fields used in the main pulse sequence, are applied as the representative phase encoding gradient magnetic fields.

4. The magnetic resonance imaging apparatus according to claim 2, wherein, in the second pulse sequence, phase encoding gradient magnetic fields of substantially average intensity, selected from those among the phase encoding gradient magnetic fields used in the main pulse sequence, are applied as the representative phase encoding gradient magnetic fields.

5. The magnetic resonance imaging apparatus according to claim 1, wherein:
    the processor-executable instructions further cause the magnetic resonance pulse sequence processor to execute a third pulse sequence in which a phase encoding gradient magnetic field that is different from the phase encoding gradient magnetic field applied in the second pulse sequence is applied, in addition to the first pulse sequence and the second pulse sequence;
    the magnetic resonance pulse sequence processor:

calculates a first phase difference from the phase differences between the plurality of echo signals collected by the first pulse sequence and second pulse sequence;
calculates a second phase difference from the phase differences between the plurality of echo signals collected by the first pulse sequence and third pulse sequence; and
calculates the amount of correction for the plurality of echo signals from the calculated first and second phase differences; and
the magnetic resonance pulse sequence processor corrects the main pulse sequence on the basis of the amount of correction that is calculated with respect to each echo signal before the main pulse sequence occurs.

6. The magnetic resonance imaging apparatus according to claim 2, wherein:
the processor-executable instructions further cause the magnetic resonance pulse sequence processor to execute a third pulse sequence in which a phase encoding gradient magnetic field that is different from the phase encoding gradient magnetic field applied in the second pulse sequence is applied, in addition to the first pulse sequence and the second pulse sequence of the second pre-scan;
the magnetic resonance pulse sequence processor:
calculates a first phase difference from the phase differences between the plurality of echo signals collected by the first pulse sequence and second pulse sequence;
calculates a second phase difference from the phase differences between the plurality of echo signals collected by the first pulse sequence and third pulse sequence; and
calculates the amount of phase correction for the plurality of echo signals from the calculated first and second phase differences; and
the magnetic resonance pulse sequence processor corrects the main pulse sequence on the basis of the amount of correction that is calculated with respect to each echo signal before the main pulse sequence occurs.

7. The magnetic resonance imaging apparatus according to claim 2, wherein:
the processor-executable instructions further cause the magnetic resonance pulse sequence processor to execute a third pulse sequence in which the readout gradient magnetic field is not applied;
a plurality of sampling gradient magnetic fields are applied in the phase encoding direction after an odd-numbered echo signal which is collected before the odd-numbered echo signal in which the sampling gradient magnetic fields start to be applied which is part of the second pulse sequence; and
a representative phase encoding gradient magnetic field, which was selected from among the phase encoding gradient magnetic fields applied in the main pulse sequence, is applied before the sampling gradient magnetic fields are applied;
the magnetic resonance pulse sequence processor:
calculates a first phase difference from the phase difference between the plurality of echo signals collected by the first pulse sequence and the phase difference between the plurality of echo signals collected by the second pulse sequence;
calculates a second phase difference from the phase difference between the plurality of echo signals collected by the first pulse sequence and a phase difference between a plurality of echo signals collected by the third pulse sequence; and
calculates the amount of correction for the plurality of echo signals, as a result of the first, second, and third pulse sequences, from the calculated first and second phase differences; and
the magnetic resonance pulse sequence processor:
corrects the intensity of the gradient magnetic field applied in the phase encoding direction with respect to each echo signal in the main pulse sequence, on the basis of the amount of correction that is calculated with respect to each echo signal before the main pulse sequence occurs.

8. The magnetic resonance imaging apparatus according to claim 1, wherein,
in the main pulse sequence when a k-space in which the echo signals are arranged, is divided into a plurality of regions in the phase encoding direction, and a group of a plurality of echo signals is collected in each of the plurality of regions,
the magnetic resonance pulse sequence processor calculates the amount of correction for each group, and
the magnetic resonance pulse sequence processor then repeatedly corrects the main pulse sequence with respect to each group as the main pulse sequence occurs.

9. The magnetic resonance imaging apparatus according to claim 2, wherein,
in the main pulse sequence, when k-space in which the echo signals are arranged is divided into a plurality of regions in the phase encoding direction, and a group of a plurality of echo signals is collected in each of the plurality of regions,
the magnetic resonance pulse sequence processor calculates the amount of phase correction with respect to each group, and
the magnetic resonance pulse sequence processor then repeatedly corrects the main pulse sequence with respect to each group as the main pulse sequence occurs.

10. The magnetic resonance imaging apparatus according to claim 7, wherein,
in the main pulse sequence, when k-space in which the echo signals are arranged, is divided into a plurality of regions in the phase encoding direction, and a group of a plurality of echo signals is collected in each of the plurality of regions,
the magnetic resonance pulse sequence processor calculates the amount of phase correction with respect to each group, and
the magnetic resonance pulse sequence processor then repeatedly corrects the main pulse sequence with respect to each group as the main pulse sequence occurs.

11. The magnetic resonance imaging apparatus according to claim 1, wherein the magnetic resonance pulse sequence processor changes the main pulse sequence, such that a correction gradient magnetic field is applied, between a flip pulse and a flop pulse.

12. The magnetic resonance imaging apparatus according to claim 2, wherein the magnetic resonance pulse sequence processor changes the main pulse sequence, such that a correction gradient magnetic field is applied, between a flip pulse and a flop pulse.

13. The magnetic resonance imaging apparatus according to claim 3, wherein the magnetic resonance pulse sequence processor changes the main pulse sequence, such that a correction gradient magnetic field is applied, between a flip pulse and a flop pulse.

14. The magnetic resonance imaging apparatus according to claim 4, wherein the magnetic resonance pulse sequence processor changes the main pulse sequence, such that a correction gradient magnetic field is applied, between a flip pulse and a flop pulse.

15. A magnetic resonance imaging apparatus comprising:
an MRI gantry including static and gradient magnetic field generators, at least one radio frequency (RF) coil coupled to an imaging volume, RF transmitter and RF receiver circuits coupled to said at least one RF coil;
a magnetic resonance pulse sequence processor; and
a memory that stores processor-executable instructions that, when executed by the processor, cause the magnetic resonance pulse sequence processor to:
execute a first pulse sequence in which no gradient magnetic field is applied in a readout direction, at least one gradient pulse is applied in a slice encoding direction and wherein a plurality of sampling gradient magnetic fields are applied in a slice encoding direction during readout of NMR echo signals, wherein the at least one gradient pulse is either (a) a pre-dephasing gradient magnetic field or (b) gradient magnetic fields applied before and after the sampling gradient magnetic fields, and
execute a second pulse sequence in which no gradient magnetic field is applied in said readout direction and wherein the plurality of sampling gradient magnetic fields in said slice encoding direction are applied at the same echo signal locations as those in the first pulse sequence, and representative slice encoding gradient magnetic fields, selected from among the slice encoding gradient magnetic fields applied in a main pulse sequence for acquiring an image, are applied;
calculate as the amount of correction, the amount of phase difference which occurs in the slice encoding direction as a result of the applied slice encoding gradient magnetic fields, based on a phase difference between a plurality of echo signals collected by the first pulse sequence and a phase difference between a plurality of echo signals collected by the second pulse sequence; and
correct the main pulse sequence on the basis of the amount of correction; and
execute the corrected main pulse sequence in order to perform phase corrected magnetic resonance imaging with the magnetic resonance imaging apparatus.

16. The magnetic resonance imaging apparatus according to claim 15, wherein, in the first pulse sequence, the sampling gradient magnetic field is applied after an odd-numbered echo signal which is collected during substantially the same period as that for which the phase encoding gradient magnetic field is zero in the main pulse sequence.

17. The magnetic resonance imaging apparatus according to claim 15, wherein:
the processor-executable instructions further cause the magnetic resonance pulse sequence processor to execute a third pulse sequence in which a slice encoding gradient magnetic field that is different from the slice encoding gradient magnetic field applied in the second pulse sequence is applied, in addition to the first pulse sequence and the second pulse sequence,
the magnetic resonance pulse sequence processor:
calculates a first phase difference from the phase differences between the plurality of echo signals collected by the first pulse sequence and second pulse sequence;
calculates a second phase difference from the phase differences between the plurality of echo signals collected by the first pulse sequence and third pulse sequence; and
calculates the amount of correction for the plurality of echo signals from the calculated first and second phase differences; and
the magnetic resonance pulse sequence processor corrects the main pulse sequence on the basis of the amount of correction that is calculated with respect to each echo signal by the magnetic resonance pulse sequence processor before the main pulse sequence occurs.

18. The magnetic resonance imaging apparatus according to claim 16, wherein:
the processor-executable instructions further cause the magnetic resonance pulse sequence processor to execute a third pulse sequence in which a slice encoding gradient magnetic field that is different from the slice encoding gradient magnetic field applied in the second pulse sequence, in addition to the first pulse sequence and the second pulse sequence;
the magnetic resonance pulse sequence processor:
calculates a first phase difference from the phase differences between the plurality of echo signals collected by the first pulse sequence and second pulse sequence;
calculates a second phase difference from the phase differences between the plurality of echo signals collected by the first pulse sequence and third pulse sequence; and
calculates the amount of correction for the plurality of echo signals from the calculated first and second phase differences; and
the magnetic resonance pulse sequence processor corrects the main pulse sequence on the basis of the amount of correction that is calculated with respect to each echo signal before the main pulse sequence occurs.

19. The magnetic resonance imaging apparatus according to claim 15, wherein:
the instructions further cause the magnetic resonance pulse sequence processor to execute a third pulse sequence in which the readout gradient magnetic field and the phase encoding gradient magnetic field are not applied;
a plurality of sampling gradient magnetic fields are applied in the phase encoding direction after an odd-numbered echo signal which is collected before the odd-numbered echo signal in which the sampling gradient magnetic fields start to be applied which is part of the second pulse sequence; and
a representative slice encoding gradient magnetic field, which was selected from among the slice encoding gradient magnetic fields applied in the main pulse sequence, is applied before the sampling gradient magnetic fields are applied;
the magnetic resonance pulse sequence processor:
calculates a first phase difference from the phase difference between the plurality of echo signals collected by the first pulse sequence and the phase difference between the plurality of echo signals collected by the second pulse sequence;
calculates a second phase difference from the phase difference between the plurality of echo signals collected by the first pulse sequence and a phase difference between a plurality of echo signals collected by the third pulse sequence; and calculates the amount of correction for the plurality of echo signals, as a result of the first, second, and third pulse sequences, from the calculated first and second phase differences; and the magnetic resonance pulse sequence processor:
corrects the intensity of the gradient magnetic field applied in the phase encoding direction with respect to each echo signal in the main pulse sequence, on the basis of the amount of correction that is calculated with respect to each echo signal by the magnetic resonance pulse sequence processor before the main pulse sequence occurs.

20. The magnetic resonance imaging apparatus according to claim 1, wherein the magnetic resonance pulse sequence processor changes the intensity of a rewind gradient magnetic field or the phase encoding gradient magnetic field in the main pulse sequence before the main pulse sequence occurs.

* * * * *